(12) United States Patent
Suzuki et al.

(10) Patent No.: US 7,042,722 B2
(45) Date of Patent: May 9, 2006

(54) ELECTRONIC EQUIPMENT

(75) Inventors: Katsuyoshi Suzuki, Odawara (JP);
Hirokazu Takahashi, Chigasaki (JP);
Masakatsu Horii, Oiso (JP); Kenichi Tateyama, Odawara (JP); Taro Takahashi, Manazuru (JP); Hiroshi Suwa, Atsugi (JP); Kouji Furuta, Nakai (JP)

(73) Assignee: Hitachi, Ltd., Tokyo (JP)

( * ) Notice: Subject to any disclaimer, the term of this patent is extended or adjusted under 35 U.S.C. 154(b) by 135 days.

(21) Appl. No.: 10/769,807

(22) Filed: Feb. 3, 2004

(65) Prior Publication Data
US 2004/0240177 A1    Dec. 2, 2004

(30) Foreign Application Priority Data
May 29, 2003  (JP) .............................. 2003-152221
Jul. 2, 2003   (JP) .............................. 2003-270426

(51) Int. Cl.
*H05K 7/20*    (2006.01)
(52) U.S. Cl. ...................................... 361/695; 454/184
(58) Field of Classification Search ........ 361/688–687, 361/694–695; 454/184
See application file for complete search history.

(56) References Cited

U.S. PATENT DOCUMENTS

| | | | |
|---|---|---|---|
| 4,739,445 A | 4/1988 | Tragen | |
| 5,247,427 A | 9/1993 | Driscoll et al. | |
| 5,267,121 A | 11/1993 | Uchida et al. | |
| 5,313,699 A * | 5/1994 | Freige et al. | 29/832 |
| 5,343,357 A | 8/1994 | Driscoll et al. | |
| 5,559,673 A * | 9/1996 | Gagnon et al. | 361/695 |
| 5,680,295 A | 10/1997 | Le et al. | |
| 5,796,580 A | 8/1998 | Komatsu et al. | |
| 6,021,042 A * | 2/2000 | Anderson et al. | 361/695 |
| 6,058,019 A * | 5/2000 | Graves et al. | 361/760 |
| 6,088,224 A | 7/2000 | Gallagher et al. | |
| 6,304,443 B1 | 10/2001 | Chou | |
| 6,317,320 B1 | 11/2001 | Cosley et al. | |
| 6,468,150 B1 | 10/2002 | Langdon et al. | |
| 6,504,718 B1 * | 1/2003 | Wu | 361/695 |
| 6,525,935 B1 * | 2/2003 | Casebolt | 361/687 |
| 6,704,196 B1 | 3/2004 | Rodriguez et al. | |
| 2003/0048607 A1 | 3/2003 | Ives et al. | |

(Continued)

FOREIGN PATENT DOCUMENTS

GB    2295669    6/1996

(Continued)

*Primary Examiner*—Gregory Thompson
(74) *Attorney, Agent, or Firm*—Mattingly, Stanger, Malur & Brundidge, P.C.

(57) ABSTRACT

An object is to effectively cool down an electronic equipment which is face with height limitations and tends to readily increase in heat generation amount to thereby provide the reliability required. The interior of a chassis of a control unit is partitioned by a back board into a front side space and a rear side space. In the rear side space, two control modules are attached so that these are stacked up and down, while two fan modules and a single duct member are attached in the front side space. Each fan module has two fans as built therein. A cooling air stream or "wind" from each fan flows into the lower-side control module through the duct member and others, whereas a cooling wind from the other fan flows into the upper-side control module. Even when either one of the fan modules goes down during operation, it is still possible by using the remaining fan module to cool down the both control modules.

15 Claims, 19 Drawing Sheets

U.S. PATENT DOCUMENTS

| | | |
|---|---|---|
| 2004/0057211 A1 | 3/2004 | Kondo et al. |
| 2004/0100770 A1 | 5/2004 | Chu et al. |
| 2004/0184233 A1 | 9/2004 | Yamada |
| 2004/0264154 A2 | 12/2004 | Kosugi |

FOREIGN PATENT DOCUMENTS

| | | |
|---|---|---|
| JP | 2000112822 | 4/2000 |
| JP | 2001338486 | 12/2001 |

* cited by examiner

FIG. 5C
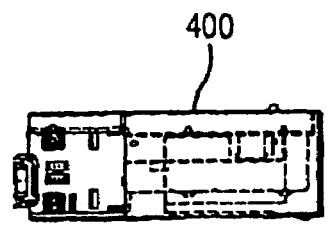
FIG. 5E  FIG. 5B  FIG. 5A
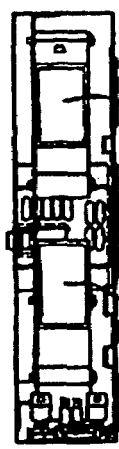 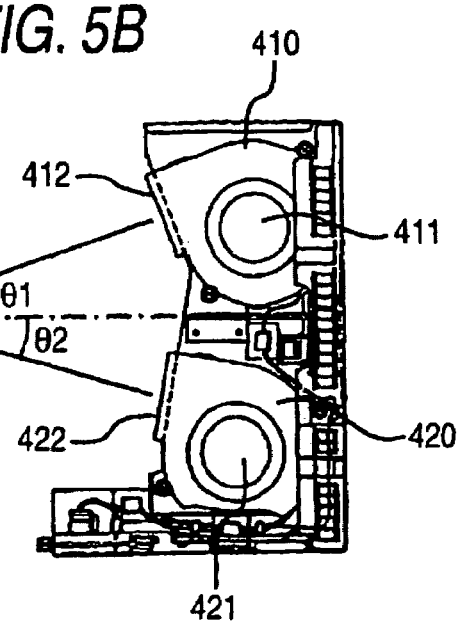 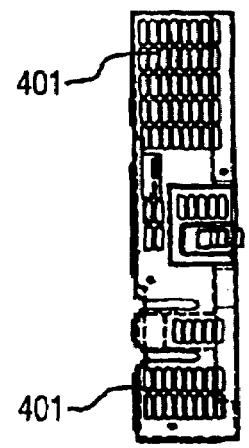
FIG. 5D
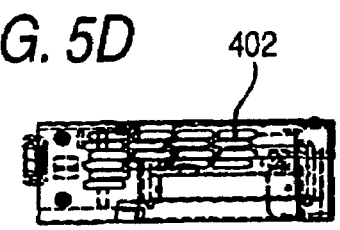

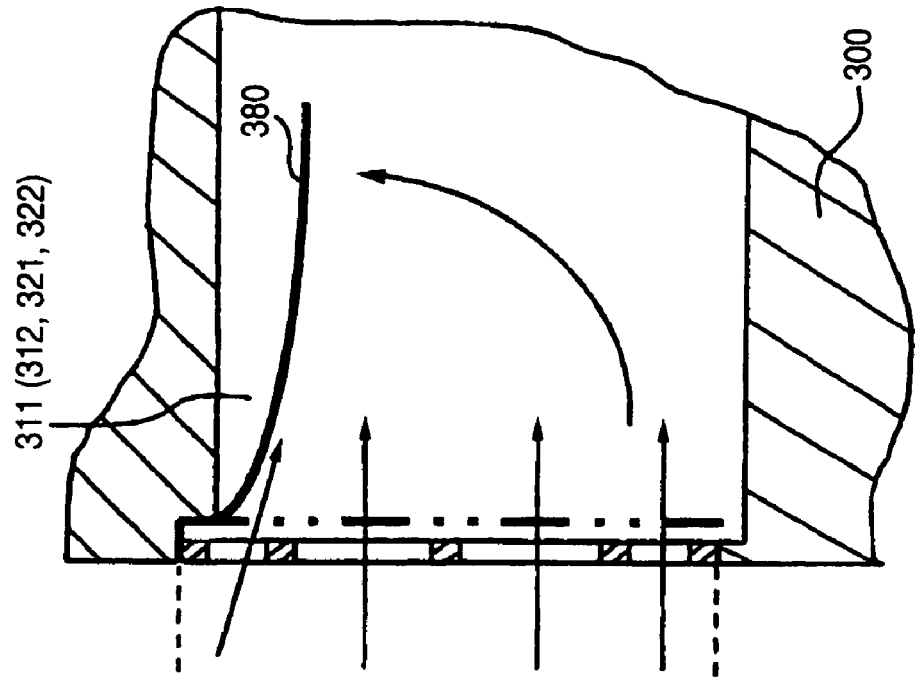
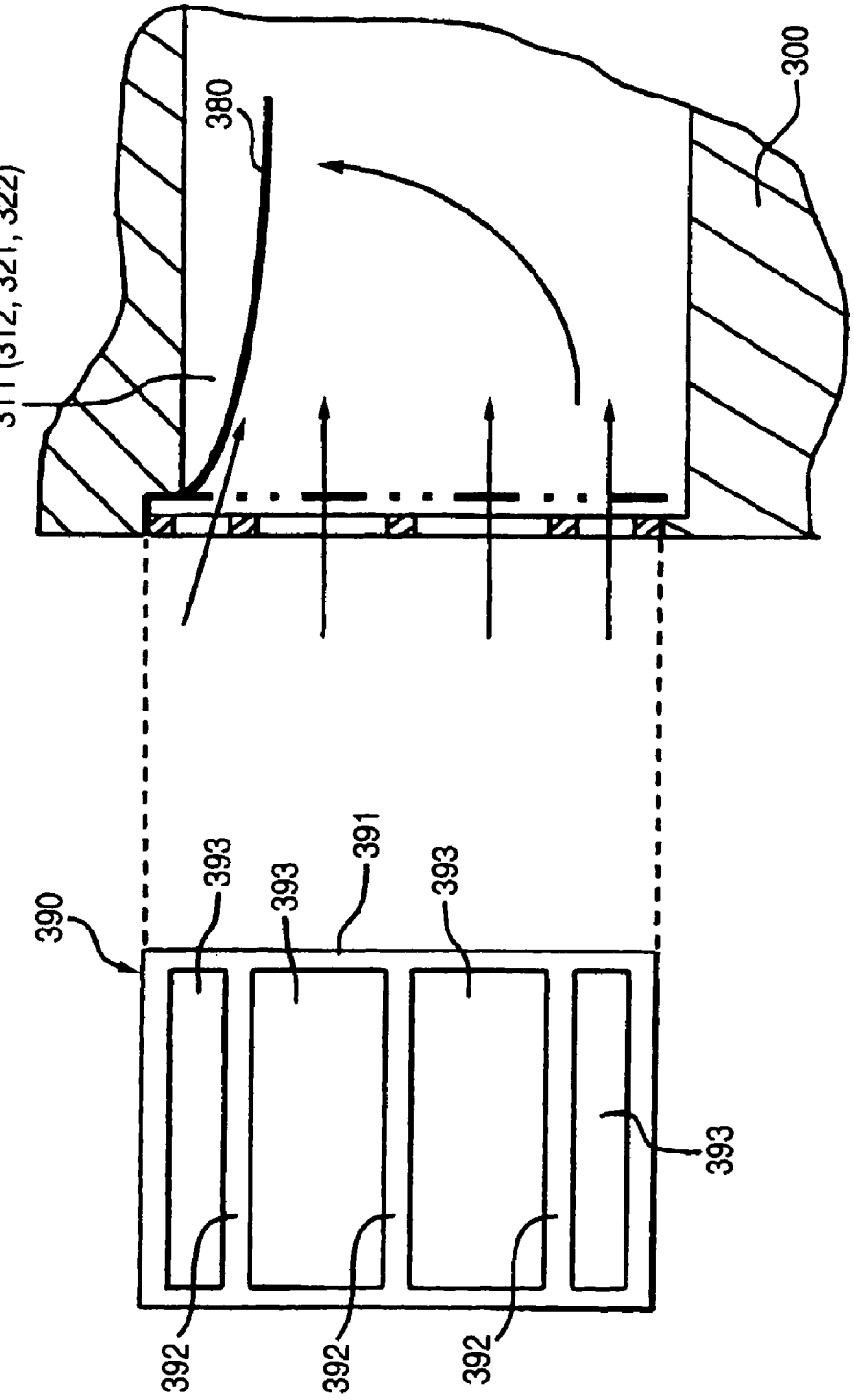

ELECTRONIC EQUIPMENT

CROSS-REFERENCE TO PRIOR APPLICATION

This application relates to and claims priority from Japanese Patent Application Nos. 2003-270426, filed on Jul. 2, 2003, and 2003-152221, filed on May 29, 2003 the entire disclosure of which are incorporated herein by reference.

BACKGROUND OF THE INVENTION

1. Field of the Invention

The present invention relates generally to electronic equipment preferably used for disk array control devices or equivalents thereto.

2. Description of Related Art

In electronic equipment such as for example a control unit for use in disk array apparatus or the like, a micro processing unit (MPU) or else is used to perform processing of a large amount of data at high speeds. Due to this, an increase in inside temperature results in a decrease in processing performance and others so that cooling fans are used to suppress such internal temperature increase (for example, see JP-A-2001-338486).

SUMMARY OF THE INVENTION

Although the above-noted prior art is designed to employ various kinds of heat-up prevention techniques, a need for achievement of data processing of high performance at further increased speeds is increasing year by year in the marketplaces. Accordingly, in order to meet the need for improvements in performance, it is required to enhance the performance of MPU or the like. However, the MPU performance improvements would result in increases in heat generation amount and in power consumption. In addition, from viewpoints of retaining attachment compatibility with conventional products and of space-saving, limitations in size arise in many cases. More specifically, while the data processing is required to offer higher performance, an increase in mechanical and physical sizes is impermissible. Thus, a need is felt to solve the conflicting problems within a predefined space in a well balanced way—that is, achieving high performance and avoiding an increase in heat generation amount due to the performance enhancement.

The present invention has been made in view of the problems stated above, and its object is to provide an electronic equipment capable of performing effective cooling operations to thereby enable performance enhancement while increasing the reliability.

To attain the foregoing object, an electronic equipment in accordance with the invention comprises a housing, a connection-use circuit board which is provided to define within the housing a one side space and a remaining side space with a plurality of cooling air-use openings and a plurality of electrical connectors being provided on the connection-use circuit board, a plurality of control modules provided to reside within the one side space while corresponding to the cooling air-use openings respectively and being electrically connected to the connection-use circuit board through the electrical connectors respectively, a plurality of fan modules provided within the remaining side space and arranged to include therein fans corresponding to the cooling air-use openings respectively, and a duct member which is placed within the remaining side space and provided between the connection-use circuit board and each of the fan modules for connecting an exhaust port of each fan to a corresponding one of the cooling air-use openings.

In one preferred form of the invention, the duct member has a plurality of inflow ports connected to exhaust ports of the fans respectively, a plurality of outflow ports connected to the cooling air-use openings respectively, and a plurality of flow paths for causing each inflow port and its associated one of the outflow ports to be coupled together while letting them be grouped per each cooling air-use opening. The duct member is made up of a plurality of dividable parts in such a way as to enable formation by division of at least one of the flow paths.

Respective ones of the flow paths may be communicably coupled together. For example, a confluence passage is provided within the duct member for coupling and communicating respective flow paths together to thereby permit cooling air streams or "winds" to meet and combine with each other. With such an arrangement, even when any one of the fans making up each fan module goes down during operation due to malfunction or the like, it is possible to efficiently perform cooling by effectively utilizing the cooling winds from all of the remaining fans with proper operability.

Preferably, a flow path system made up of each inflow port and each flow path plus each outflow port of the duct member is formed to have a shape which causes a cooling wind to hardly flow back from each exhaust port toward each inflow port.

Furthermore, an open/close valve is provided at each inflow port for allowing a cooling wind from each fan to flow into inside of each flow path and for avoiding reverse flow thereof. The open/close valve may be made of a material having flexibility. Examples of the value having flexibility include a lightweight valve made of a polymeric material (such as rubber or else) having elasticity, which is formed into either a film shape or a thin plate shape. The valve opens due to the pressure of a cooling wind being exhausted from a fan and then allows the cooling wind to flow into a flow path. Upon interruption of the fan, the valve closes due to its own weight or a pressure difference to thereby block an inflow port. Thus it is possible to prevent occurrence of a reverse flow when the fan stops. Additionally, in case the valve is formed into a flat plate-like film shape from an elasticity-rich material, it is preferable to comprise a defense mechanism in such a way as to prevent the valve from changing in shape upon closure thereof to thereby ensure that it hardly escape to outside of the inflow port. An example of this defense mechanism is the one that has a stopper member at the inflow port, which member controls the close position of the valve. For example, the stopper member is preferably designed to offer the capability to support at least an almost central portion of the valve while being formed to have a small area to thereby prevent the inflow port from decreasing in flow path area.

In accordance with one preferred form of the invention, each fan of each fan module is arranged as a sirocco fan for performing air intake from an axial direction and air exhaust in a radial direction, wherein an exhaust port of each fan is disposed to face inwardly.

In one form of the invention, when any one of the fan modules stops its operation, control is made to cause the remaining fan module to increase in air blow power.

In one form of the invention, each of the control modules is such that more than one electronic component acting as a heating body is disposed in close proximity to the cooling air-use openings.

In one form of the invention, the equipment further comprises a power supply module disposed adjacent to each control module within the one side space of the housing, and a thermal insulating ventilation path formed between the power supply module and each control module.

In one form of the invention, the power supply module includes an air inlet fan. A communicating hole is formed on a downstream side of the thermal insulating ventilation path, for causing a cooling air which cools down each control module to escape toward the outside through the air inlet fan of the power supply module.

In one form of the invention, the control module includes a converter circuit for converting a high voltage input being supplied from the power supply module into a low voltage output, wherein the converter circuit is disposed near the cooling air-use openings.

In one form of the invention, at least either one of the cooling air-use openings of the connection-use circuit board is formed of a plurality of openings.

In one form of the invention, the plurality of openings are provided for reducing the length of a wiring pattern of the connection-use circuit board.

In one form of the invention, the equipment further comprises a battery module disposed adjacent to each fan module within the remaining side space of the housing. The battery module has a plurality of communicating holes formed in each of a first side face neighboring upon each fan module and in a second side face facing an outside, for supplying an outside air from each communication hole of the second side face to the fan module through each communicating hole of the first side face.

These and other objects, features and advantages of the invention will be apparent from the following more particular description of preferred embodiments of the invention, as illustrated in the accompanying drawings.

BRIEF DESCRIPTION OF THE DRAWINGS

FIGS. 5A to 5E are projection diagrams of a fan module.

FIGS. 6A and 6B show perspective views of a duct member, wherein FIG. 6A is in the case of looking at it from a front face, whereas FIG. 6B is when viewing from its rear face.

FIGS. 13A and 13B are diagrams each showing the flow of a cooling air stream within the control module, wherein FIG. 13A shows a flow of cooling air within the upper-side control module whereas FIG. 13B shows a flow of cooling air within the lower-side control module 700.

FIGS. 14A–14B are diagrams each showing a rush current preventing circuit for hot plug/unplug use, wherein FIG. 14A shows a case where a P-channel MOSFET whereas FIG. 14B shows a case using an N-channel MOSFET.

FIGS. 19A and 19B are diagrams showing a third embodiment of the invention, wherein FIG. 19A is a plan view of a stopper member provided at an inflow port of a duct member, and FIG. 19B is an enlarged cross-sectional view of a portion near the inflow port of the duct member.

FIGS. 20A–20B are diagrams each showing an enlarged sectional view of the part near the inflow port of the duct member, wherein FIG. 20A is in the state that a fan is rendered operative resulting in an open/close valve being opened, and FIG. 20B is in another state that the fan goes down resulting in the valve being closed.

DETAILED DESCRIPTION OF THE INVENTION

Hereinafter, a preferred embodiment of the present invention will be explained with reference to FIGS. 1 to 16, while taking an example which applies it to a control unit of disk array apparatus. Firstly, an overview of an entirety of the control unit 30 will be explained in brief; next, an explanation will be given of an entire configuration of the disk array apparatus using the control unit 30, followed by a detailed explanation of respective components or parts of the control unit 30. In this embodiment, various types of cooling techniques are employed as will be described below.

Embodiment 1

1. Overview of Control Unit

Figure 1:
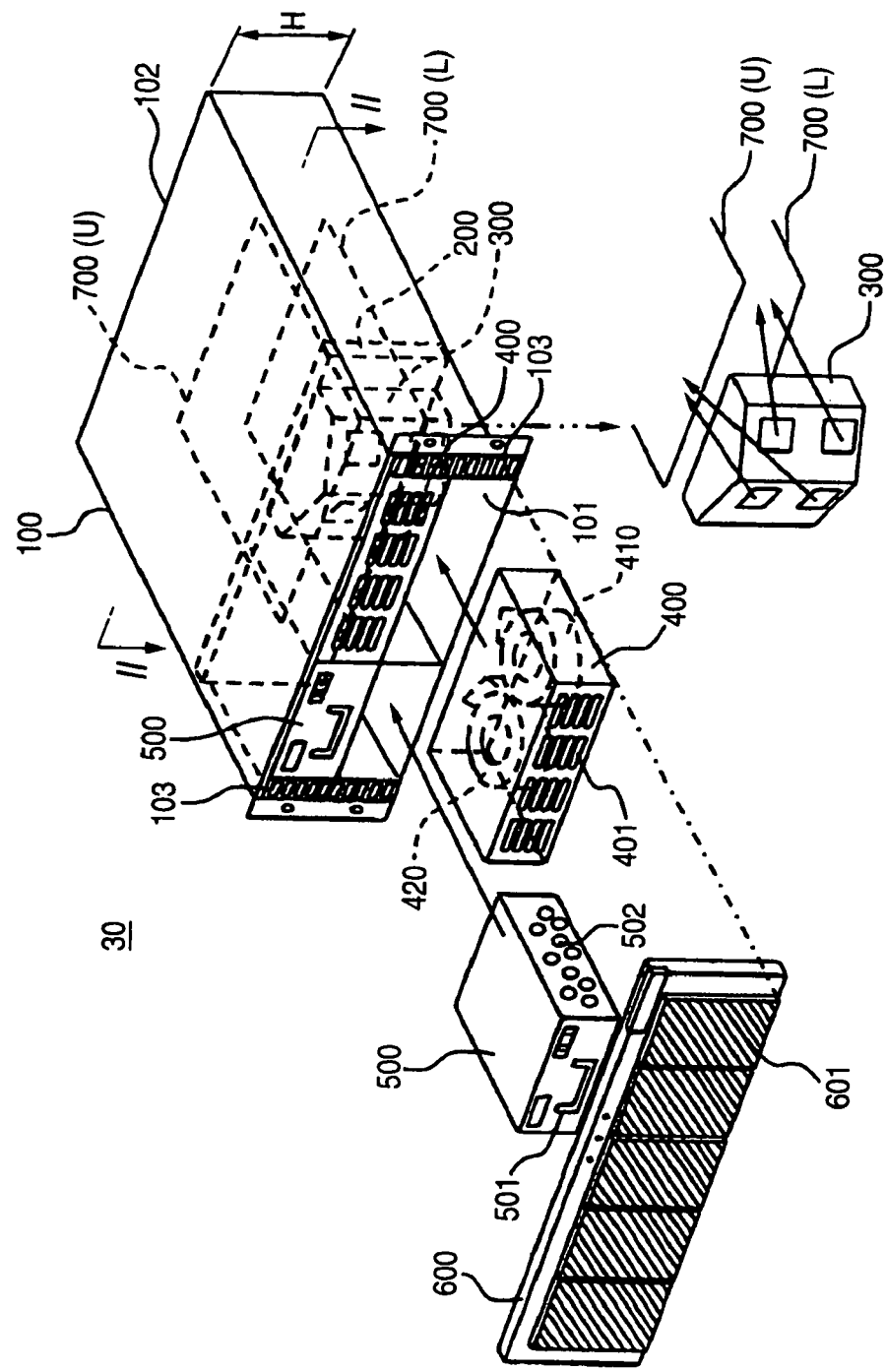
FIG. 1 is a diagram showing an exploded perspective view of a control unit in accordance with a first embodiment of the present invention.
Figure 4:
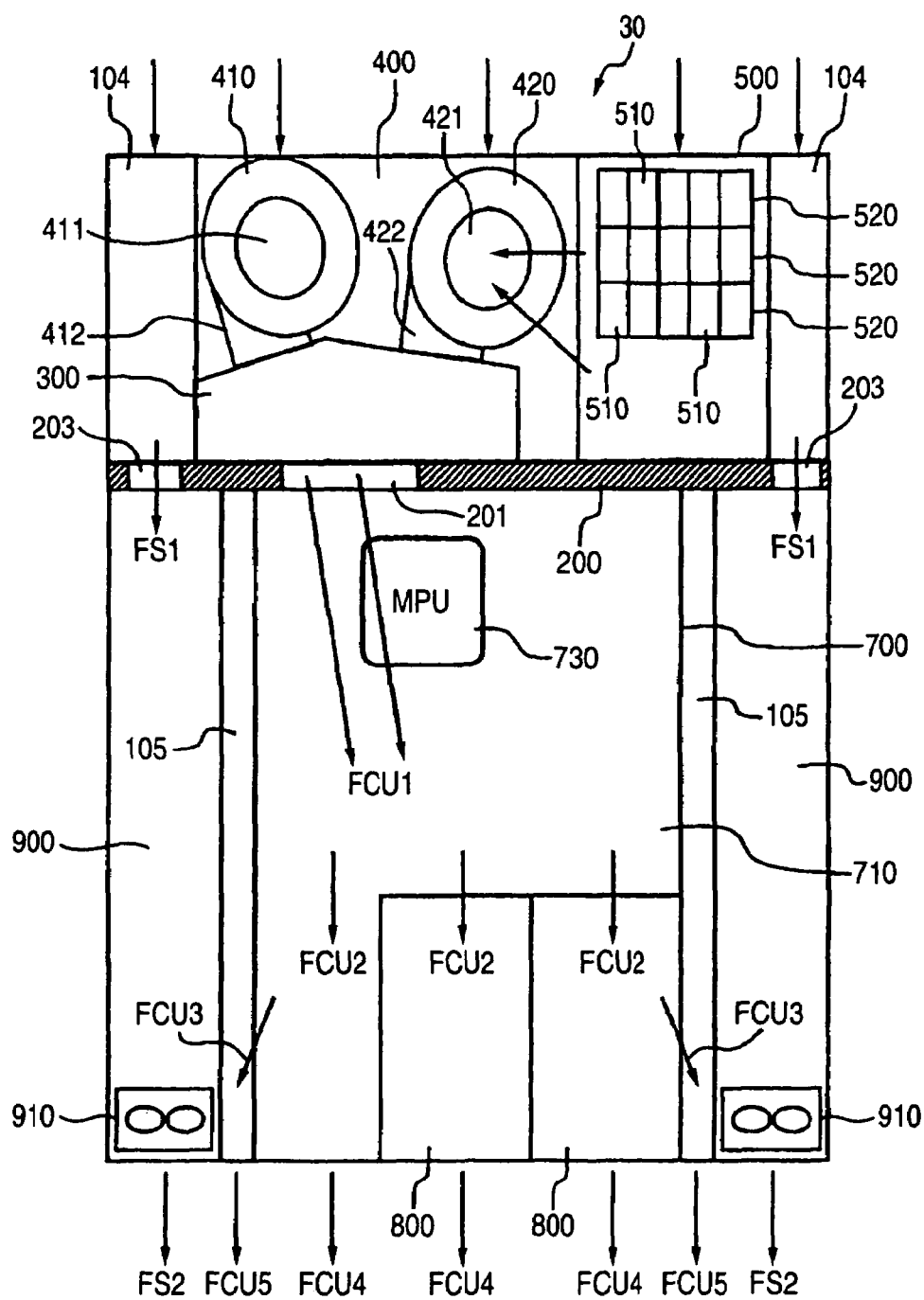
FIG. 4 is an explanation diagram showing an overview of a cooling structure within the control unit.

FIG. 1 is an exploded perspective view showing an overview of the control unit 30. The control unit 30 is a device which controls an operation of disk array apparatus 1 as will be described later. The control unit 30 is generally made up of a chassis 100, back board 200, duct member 300, two fan modules 400, two battery modules 500, decorating door 600, two control modules 700, two interface modules (to be referred to as "I/F" modules hereinafter, a detail of which is shown in FIG. 4) 800, and two power supply modules 900, as will be later described respectively.

The chassis 100 is made of a metallic material such as stainless steel or the like, which is formed for example into a hollow box-like shape. A front side opening 101 that is positioned on this side in the drawing and a rear side opening 102 that is placed on the far side in the drawing are formed on the both end sides along a longitudinal direction of the chassis 100. The chassis 100 is arranged to be decomposable by use of clamping members such as screws or the like in such a way that its one side and the remaining three sides are detachable, for example. In addition, air intake holes 103 are formed on the both sides of the front side opening 101 of chassis 100 respectively. Each hole is coupled to and communicated with a front side duct 104, which is formed within a front side space of the chassis 100 to extend in the longitudinal direction.

Here, the chassis 100 is such that its height H and other sizes are determined in such a way as to enable accommodation into a dedicated rack 10 to be later described. The height H is designed to become less than or equal to 3U (about 133.35 mm) as defined by "EIA-310-D" of the EIA Standards. For harmonization with this chassis height H, the height of each module to be attached into the chassis 100 are also determined. Note that the shape, material, height size and others are mere exemplary, and the invention should not be limited thereto.

The back board 200 is the one that holds each control module 700 while performing electrical connections between respective control modules 700 and with other modules. The back board 200 is positioned at a location near the front side opening 101 of the chassis 100 and is vertically provided at an almost midway portion in the longitudinal direction of chassis 100. The back board 200 is formed into an almost flat plate shape and is provided with opening portions 201–203 for cooling air stream or "wind" use and electrical connectors 210–213 as will be described later.

By attaching the back board 200 to inside of the chassis 100, a rear side space and a front side space are partitioned within the chassis 100 respectively, wherein the former spans from the rear side opening 102 up to a rear face of the back board 200, whereas the latter expands from the front side opening 101 to a front face of back board 200, respectively. Thus, the interior space of chassis 100 is bisected by the back board 200—basically, the front side space and the rear side space are separated from each other. However, in this invention, forming predetermined cooling wind-use openings 201–203 at specified positions causes the front side space and the rear side space to be partly coupled together for communication through the back board 200, thereby enabling achievement of effective cooling in a way as will be described later. As apparent from the foregoing, the back board 200 realizes respective functions, including the support function for supporting each control modules 700, the connection function for electrical connection of each control module 700 or the like, the space-forming function for forming spaces (front side space and rear side space) within the chassis 100, and the cooling function for causing a cooling air stream or "wind" from the front side space to flow into the rear side space.

The duct member 300 is for exhausting cooling winds as sent from respective fan modules 400 in a way that cooling winds are combined together per each control module 700. The duct member 300 is placed within the front side space in the chassis 100 and is detachably provided between one front face side (right side in FIG. 1) of the back board 200 and each fan module 400. The duct member 300 is made for example of a plastic foamed material, which is formed into a box-like shape having an approximately pentagonal lateral cross-section and is coated with a resin or other suitable materials on its surfaces to thereby prevent generation of dusts or else. Although details will be described later, the duct member 300 has its front face in which a total of four inflow ports are provided in a way corresponding to respective exhaust ports of each fan module 400, while a total of two exhaust ports are provided on the rear face side of duct member 300, which correspond to the control modules 700 respectively. Also formed in the duct member 300 are flow paths for coupling together each inflow port and each exhaust port in order to guide a cooling air stream or "wind" coming from one of the two exhaust ports of each fan module 400 toward an upper side control module 700 while at the same time guiding a cooling wind from the other exhaust port toward a lower side control module 700.

Each fan module 400 is the one that creates a cooling wind for cooling each control module 700 within the chassis 100. Each fan module 400 is made up of a pair of horizontally neighboring fans (preferably, sirocco fans) and has two independent exhaust ports. Each fan module 400 has its front face and a side face adjacent to a battery module 500, in which air intake holes 401 are formed respectively (only one air intake hole on the front face side is depicted). Each fan module 400 sucks the outside air by each fan and exhaust sit in a radial direction. Respective fan modules 400 are arranged so that these are stacked vertically and then inserted into the front side space of the chassis 100 and next detachably attached thereto while opposing the front face side of the duct member 300.

A cooling wind to be exhausted from one exhaust port (the left side exhaust port in FIG. 1) of the two exhaust ports of each fan module 400 is arranged to flow into the rear side space of the chassis 100 from the duct member 300 through the upper side cooling wind-use opening 201 of the back board 200, thereby cooling down the control module 700 that is attached on the upper side within the chassis 100. Similarly, a cooling wind being exhausted from the other exhaust port of each fan module 400 is arranged to flow into the rear side space of chassis 100 from the duct member 300 through the lower side cooling wind-use opening 202 of back board 200, thereby cooling down the control module 700 that is attached on the lower side within the chassis 100.

In this way, since each fan module 400 is arranged so that two exhaust ports drain out the cooling winds for separate control modules 700 respectively, even in cases where either one of the fan modules 400 becomes inoperative due to occurrence of an obstruction or the like, it is possible to continue cooling of the two control modules 700 by use of the remaining fan module 400 with proper operability. By employing such redundancy arrangement, the "fail safe" functionality is attained during cooling. In addition, upon occurrence of obstructions, a drive voltage for such normal fan module 400 is increased to thereby increase the air blow power.

Each battery module 500 is the one that supplies emergency-use electric power in power failure events. Ventilation holes 502 are formed in the front face of each battery module 500 and in a side face opposing each fan module 400 (only the side-face vent holes are visible in FIG. 1). Each battery module 500 receives therein a plurality of batteries as will be described later, and is arranged so that whenever electric power to the disk array apparatus 1 is shut down due to power failure or the like, data in a cache memory is written into a certain disk drive to enable supplement of electric power until a scheduled shut-down is automatically completed. Thus it is possible to avoid data loss in power failure events. Additionally, the built-in batteries loose power with time. In view of this, in order to facilitate periodical replacement of each battery module 500, each battery module 500 is provided so that its front face is exposed to the front face opening of the chassis 100, with a user-holdable handle 501 provided at the front face of each battery module 500. A user holds the handle 501 and then draws a battery module 500 out of the chassis 100, thereby enabling easy replacement of it with a new product of battery module 500.

The decorating door 600 is for covering the front side opening 101 of the chassis 100 after having attached the duct member 300 and each fan module 400 and also each battery module 500 in the front side space of chassis 100. The decorating door 600 is detachably attached to the chassis 100 and has a plurality of louvers 601 that are detachably attached to the door 600. Each louver 601 has air ventilation capability, permitting outside air to flow into the inside of chassis 100 through each louver 601.

Each control module 700 is to control an operation of the disk array apparatus 1 and is arranged to include two control circuit boards 710 and 720 each mounting thereon a micro processing unit (MPU) and a cache memory or else. Each control module 700 is placed within the rear side space of the chassis 100 and disposed apart in the vertical direction. Terminals which are formed at a front end portion of each control module 700 are arranged to mate with connectors that are provided on the rear face side of the back board 200 respectively, whereby respective control modules 700 are electrically connected to each other via wiring lines formed on the back board 200. In addition, each control module 700 is mechanically supported by back board 200. Respective control modules 700 mutually share a cache memory to thereby increase the cache storage capacity, thus speeding up data access from a host computer. Note here that in the explanation below, when it is necessary to specifically identify the upper and lower control modules from each other, the control module 700 on the upper side will be called an upper-side control module 700U, while the control module 700 on the lower side will be called a lower-side control module 700L.

2. Appearance of Disk Array Apparatus

Figure 2:
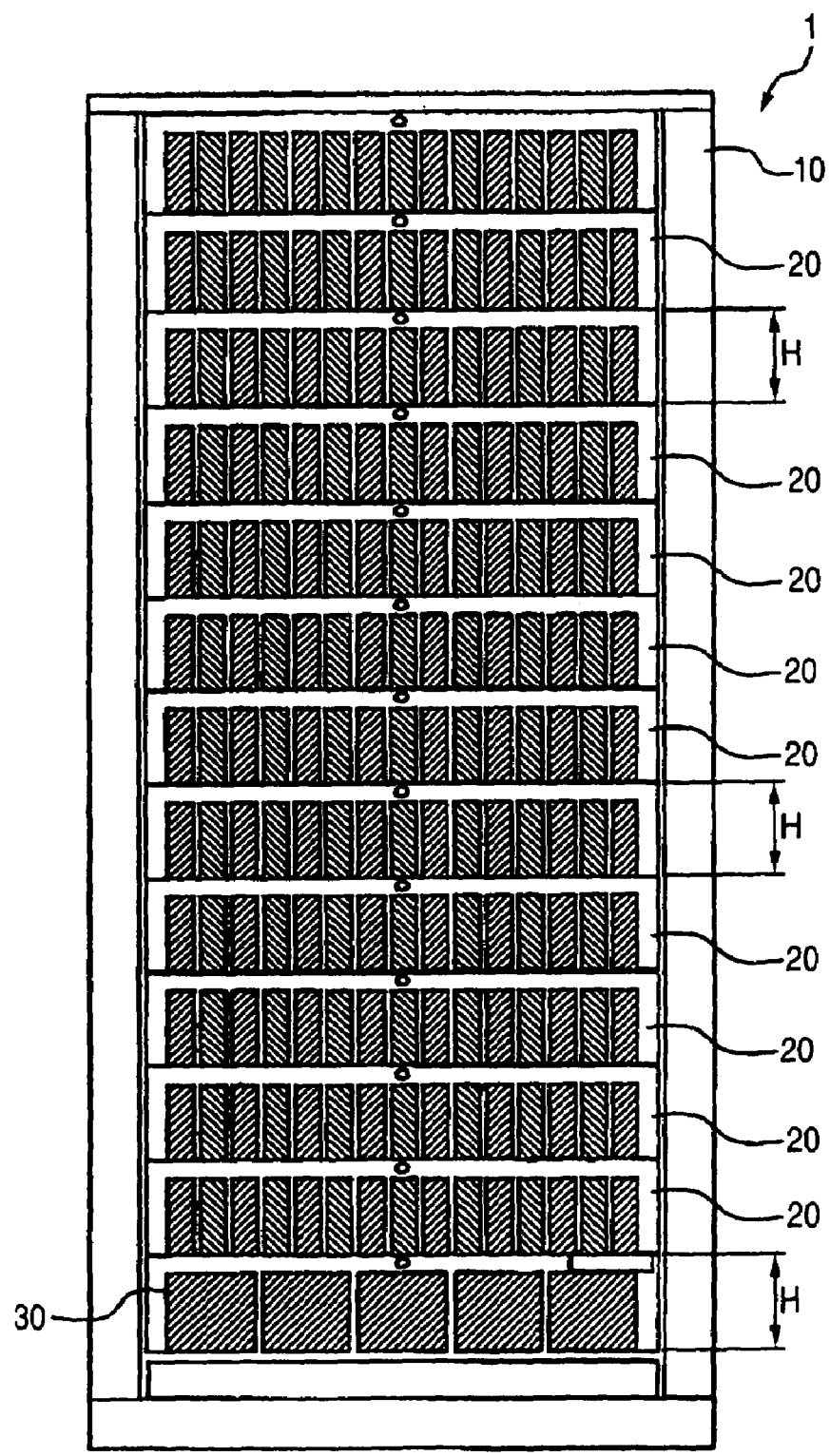
FIG. 2 is a front view of a disk array apparatus using the control unit.

FIG. 2 is a front view of the disk array apparatus 1. The disk array apparatus 1 is constituted from a dedicated rack 10, a plurality of hard disk units 20 received within the rack 10, and a control unit 30 for control of operations, such as data access to each hard disk unit 20.

Each hard disk unit 20 and control unit 30 respectively have height values H being set at the above-noted value of 3U. The dedicated rack 10 has a lateral width value of about 19 inches, for example. Each hard disk unit 20 and control unit 30 received within the rack 10 are the same in width value. Additionally, each hard disk unit 20 and control unit 30 are the same in depth value also. Accordingly each hard disk unit 20 and control unit 30 have the same outer size and thus exhibit consistency in exterior appearance. Optionally, if problems as to wiring schemes are not considered, each module 20, 30 may be freely laid out within the rack 10.

3. Architecture of Disk Array Apparatus

Figure 3:
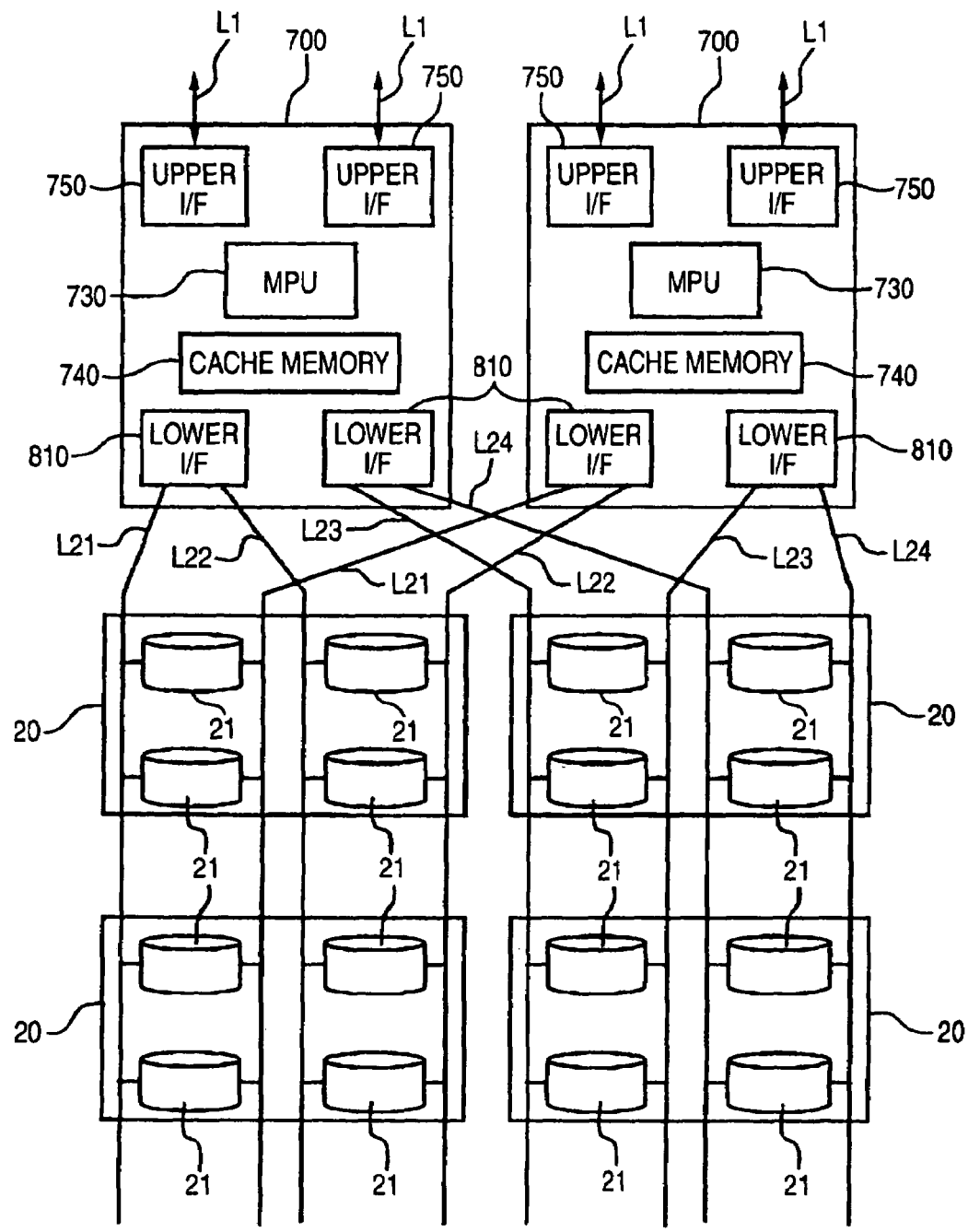
FIG. 3 is a block diagram schematically showing a control structure of the disk array apparatus.

FIG. 3 is a diagram schematically showing a configuration of the disk array apparatus 1 for explanation of an overview of the control architecture thereof. Each control module 700 is connected from upper-level I/Fs 750 via wiring lines L1 to host computers (not shown) for use as upper-level apparatuses in such a way as to offer bidirectional data communicability. In addition, each control module 700 is connected from lower-level I/Fs 810 of I/F modules 800 through wires L21 to L24 to a disk device 21 of each hard disk unit 20, which is a lower-level device. Examples of the host computers include, but not limited to, personal computers, workstations, and main frames.

A local area network (LAN) or storage area network (SAN) or the like may be used as the wiring lines L1 for connection between the host computers and the control modules 700. In the case of using the SAN, high-speed data communications are performed in accordance with fiber channel protocols. The control modules 700 are directly connected to respective hard disk units 20 by wiring lines L21–L24 for example. Note here that the above is mere exemplary, and the invention is not limited thereto.

Each control module 700 is equipped with an MPU 730 and cache memory 740 and others, and is arranged to process a data write request and data read request in accordance with a command(s) as received from a host computer. A logic volume (logic unit) is set on a physical storage region, which is provided by the disk device 21 of each hard disk unit 20 with data being stored on this logic volume. By each hard disk unit 20, it is possible to perform data management in the architecture of redundant array of independent (inexpensive) disks, known as "RAID."

Each control module 700 is responsive to a data write request, for writing into a certain logic volume the data that is temporarily stored in the cache memory 740. In addition, each control module 700 reads certain data out of a specified logic volume in response to a data read request and then transfers the data to a host computer. In the illustrative example, each control module 700 has two channels. Accordingly, an entirety of control unit 30 has four channels in total and is arranged to offer an ability to individually process data input/output requests from four host computers.

4. Cooling Structure of Control Unit (Overview)

Next, based on FIG. 4, an explanation will be given of an entire overview of a cooling structure of the control unit 30 in accordance with the present invention. FIG. 4 is a schematic diagram of the control unit 30 when looking at it from an arrow-indicated direction A—A in FIG. 1.

A rough flow of a cooling air stream or "wind" within the chassis 100 of control unit 30 will be explained with reference to FIG. 4. The cooling wind that flows within the chassis 100 is generally dividable into two kinds. One of them is a cooling wind which is forcibly sent by two fan modules 400. The other is a cooling wind which is created by air inlet fans 910 that are built in a total of two power supply modules 900 being respectively disposed on the both sides of the rear side space of the chassis 100.

First, the cooling wind to be created by each fan module 400 will be discussed in detail. The fan module 400 is designed to take in the air streams coming respectively from two inlet paths—namely, air intake holes 401 in the front face of fan module 400, and battery module 500. When the pressure near each fan module 400 is lowered by activation of each fan module 400, an air stream flows into the battery module 500 from the ventilation holes 502 of battery module 500. Then, this inflow air behaves to flow into each fan module 400 through the vent holes 502 in the side face of the battery module 500. Each fan 410, 420 of each fan module 400 sucks the air from an inlet port 411, 421, causing the sucked air to escape from an exhaust port 412, 422 owing to the rotation force of fan blades.

The cooling wind exhausted from the fan 410, 420 of each fan module 400 flows into the duct member 300, resulting in separation into a cooling wind leading to the upper-side control module 700U and a cooling wind approaching the lower-side control module 700L. The cooling wind leading to the upper-side control module 700U flows out of an upper-side outflow port of the duct member 300 and then flows into the upper-side control module 700U through the upper-side opening 201 of back board 200. Similarly, the cooling wind approaching the lower-side control module 700L flows out of a lower-side outflow port of the duct member 300 and then flows into the lower-side control module 700L through the lower-side opening 202 of back board 200.

Each control module 700 is structured from two spaced-apart control circuit boards 710 and 720, which are disposed at upper and lower locations respectively. Due to this, the cooling wind that has flown into inside of each control module 700 through the opening 201, 202 of the back board 200 is separated into an upper-side cooling wind FCU for cooling down the upper-side control board 710 and a lower-side cooling wind FCL for cool down of the lower-side control board 720, which winds cool down the control boards respectively. In FIG. 4, there is shown the behavior of a cooling wind or the like which flows on or above the upper-side control board 710 of the upper-side control module 700U. The upper-side control module 700U and lower-side control module 700L are slightly different from each other in the cooling wind's flow behavior; however, these are substantially the same as each other in basic cooling structure per se. Similarly, the upper-side control board 710 and lower-side control board 720 within the same control module also exhibit no appreciable changes in rough flow of cooling wind, although these are somewhat different from each other in cooling wind flow pattern.

Then, the flow of cooling wind will be discussed while looking at the upper-side control board 710 of upper-side control module 700U. A cooling wind FCU1 which has flown onto the upper-side control board 710 of upper-side control module 700U from the upper-side opening 201 of back board 200 first cools down the MPU 730 and its peripheral electronic parts or components, which are provided to reside in close proximity to the upper-side opening 201. Next, the cooling wind that has absorbed the heat of the MPU 730 reaches an intermediate portion of the upper-side control board 710 and then becomes a cooling wind FCU2, which cools down the I/F module 800 and peripheral electronic parts.

A cooling wind FCU3 which is part of the cooling wind FCU2 that has reached the intermediate portion of the upper-side control board 710 flows into respective rear side ducts 105 from the both sides of the upper-side control board 710, which ducts are formed within the rear-side space of the chassis 100 respectively. These respective rear side ducts 105 are positioned in the rear-side space of chassis 100 and formed between each control module 700 and each power supply module 900. Each rear side duct 105 is formed so that only its part on the downstream side thereof is coupled to and communicates with inside of each control module 700. Whereby, each rear side duct 105 exhibits thermal insulation effects in an area spanning from its upstream region to a midstream region, thereby preventing transmission of the heat coming from each power supply module 900 toward each control board 710, 720. The cooling wind that has cooled respective electronic components of the upper-side control board 710 is exhausted to the outside from the ventilation holes that are formed in the rear face of control module 700, as shown by an exhaust air stream FCU4. Additionally the cooling wind FCU3 that has flown into the rear side duct 105 from control module 700 will be externally exhausted as shown by an exhaust air FCU5.

The same goes with the flow of a cooling wind on or above the lower-side control circuit board 720. In this way, each control board 710, 720 within control module 700 is arranged to be cooled down by the cooling wind being forcibly sent from each fan module 400.

Next, an explanation will be given of the flow of other cooling winds. Each power supply module 900 is arranged to have built-in air inlet fans 910 on its rear side so that activation of these respective inlet fans 910 causes the outside air to be sucked to thereby cool down the power supply module 900. More specifically, when each inlet fan 910 becomes operative, the air flows from respective inlet holes 103 which are formed in the front face of the chassis 100 on the both sides into the front side duct 104 that is formed on the both sides of chassis 100. Each front side duct 104 is designed as a dedicated duct for cooling down the power supply module 900. The air that has flown into each front side duct 104 flows into each power supply module 900 through each side opening 203 of the back board 200, as a cooling wind indicated by symbol FS1. The cooling wind FS1 that has flown into each power supply module 900 cools down the interior of each power supply module 900 and is then exhausted by each air inlet fan 910 to the outside as an exhaust air FS2.

The discussion above is an outline of cooling winds flowing within the chassis 100. Details of the cooling winds and each module relating thereto will be described later in greater detail.

5. Structure of Battery Module

An explanation will next be given of the structure of each battery module 500 with reference to FIG. 4. Each battery module 500 is arranged by parallel connection of three battery units 520, each of which has a series connection of five batteries 510. The three battery units 520 are controlled to be equally charged up. Here, if there is a difference in temperatures of respective batteries 510, then the batteries degrade in performance due to such temperature difference. In addition, if a difference in wire length between respective batteries 510 and/or between respective battery units 520, then a difference in impedance also increases, which makes it impossible to perform equalized charge-up. In view of this, in this embodiment, as shown in FIG. 4, the three battery units 520 are laid out in such a manner that these are in parallel with the back board 200 while neighboring upon one another. This lessens each battery 510's temperature difference and wire length difference, thus enabling equal chargeup to be performed.

6. Fan Module Structure

An explanation will next be given of the structure of each fan module 400 with reference to FIGS. 5A to 5E. FIGS. 5A–5E are a set of projection drawings, wherein FIG. 5A is a front view, FIG. 5B is a top plan view, FIG. 5C is a right side view, FIG. 5D is a left side view, and FIG. 5E is a back view.

As shown in FIG. 5A, the front part of the fan module 400 is exposed to the front-side opening of the chassis 100, with air intake holes 401 formed therein for intake of the outside air. In addition, as shown in FIG. 5D, air intake holes 402 for intake of air from inside of the battery module 500 are formed in a side face of fan module 400 neighboring upon the battery module 500 side. As shown in FIG. 5C, the other side face of fan module 400 is adjacent to the front side duct 104 of chassis 100 so that no air intake holes are formed therein. This is because each front side duct 104 becomes a dedicated duct for taking ambient air into the power supply module 900.

As shown in FIG. 5B, each fan 410, 420 is arranged, for example, as a lateral flow type fan which sucks air from an inlet port 411, 421 in the axial direction and then exhausts the air from an exhaust port 412, 422 in the radial direction, respectively. In this embodiment a sirocco fan is employed for use as the lateral flow type fan. Employing the sirocco fan makes it possible to provide a sufficient amount of air flow or "wind" while having a relatively small size. It is also possible to prevent reverse flow from inside of the chassis 100.

Also note that in this embodiment, each fan 410, 420 is designed to have the same structure while using a total of four identical fans for two fan modules 400. Sharing the fans in this way is aimed at reduction of manufacturing costs. If the right and left fans 420, 410 are designed to be opposite in rotation direction to each other, then it is also possible to design the layout of fans to have a symmetrical structure. However, in such case, it is required to use two types of fans different from each other in rotation direction, resulting in increases in production costs and in parts management costs or else. It must be noted that the invention is not limited thereto and may also include the case of employing the rotation direction-different fans.

As previously stated, there are provided to the air inlet port 411, 421 of each fan 410, 420 both an air stream which flows into the fan module 40 from the air intake ports 401 being formed in the front face of fan module 400 and an air stream which flows into the battery module 500 from the ventilation holes 502 of battery module 500 while flowing into battery module 500 through the air intake holes 402 in the side face of fan module 400. Establishing the two kinds of air inlet systems in this way makes it possible to achieve a sufficient amount of air stream or "wind."

The exhaust port 412, 422 of each fan 410, 420 is tilted by angle θ1, θ2 with respect to a center line respectively. More specifically, a cooling wind is exhausted from each fan 410, 420 in the form that it converges toward the center. Whereby, it is possible to lessen the shape of duct member 300 for separating the cooling wind from each fan module 400 into portions flowing along prespecified flow paths. It is also possible to force the cooling wind to escape from fan module 400 in substantially a parallel way. In this case, however, it is necessary to also enlarge the front face shape of duct member 300 which accepts the cooling wind, resulting in an increase in size of duct member 300. The fan module 400 in accordance with the invention is arranged to exhaust the cooling wind so that it goes toward the center. Thus it is possible to downsize the duct member 300.

7. Structure of Duct Member

Figure 6A:
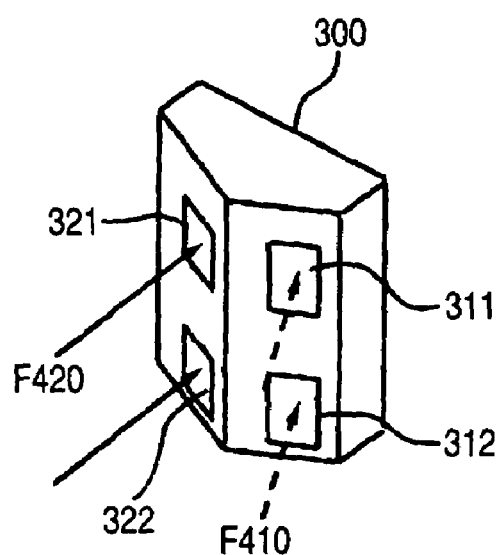
Figure 6B:
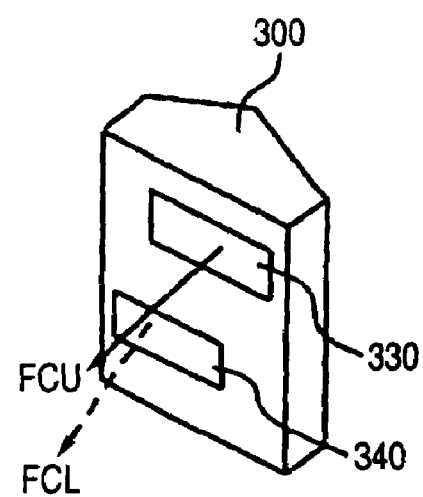

Next, an explanation will be given of the structure of the duct member 300 with reference to FIGS. 6A to 9C. First, refer to perspective views of FIGS. 6A–6B. FIG. 6A is a perspective view of the duct member 300 when looking at it from its front side, whereas FIG. 6B is a perspective view of duct member 300 when looking at from its back side. As shown in FIG. 6A, inflow ports 311–312 and 321–322 are formed on the front side of the duct member 300 opposing each fan module 400, which are coupled to exhaust ports 412, 422 of each fan 410 respectively. As shown in FIG. 6B, two outflow ports 330, 340 corresponding to respective openings 201, 202 of the back board 200 are formed on the back side of duct member 300. An upper-side outflow port 330 corresponds to the upper-side opening 201 of back board 200, while a lower-side outflow port 340 corresponds to the lower-side opening 202 of back board 200. A cooling air stream or "wind" F410, F420 being exhausted from each fan 410, 420 flows into the duct member 300 from each inflow port 311, 312, 321, 322. A cooling wind FCU that has flown from the outflow port 330 flows into the upper-side control module 700U through the upper-side opening 201 of back board 200; a cooling wind FCL flown from the outflow port 340 flows into the lower-side control module 700L via the lower-side opening 202 of back board 200.

Figure 7:
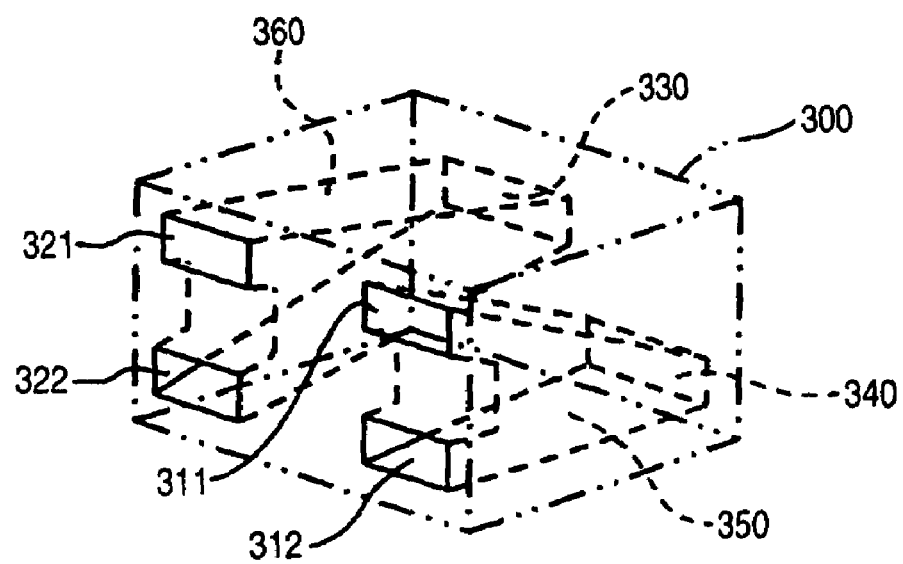
FIG. 7 is a perspective view of an internal structure of the duct member.

As shown in FIG. 7, the inflow ports 311, 312 on one side (right side in FIG. 7) to which one-side fans 410 of each fan module 400 are connected are coupled to the upstream side of the lower-side flow path 350 respectively and integrated together. The downstream side of the lower-side flow path 350 is coupled to lower-side outflow port 340. In contrast, the outflow ports 321, 322 on the other side to which fans 420 on the other side are coupled to the upstream side of the upper-side flow path 360 respectively and integrated together. The downstream side of the upper-side flow path 360 is coupled to upper-side outflow port 330. Accordingly, respective fan modules 400 are arranged so that the fan 410 on one side cools down the lower-side control module 700L, while the fan 420 on the other side cools the upper-side control module 700U. With such an arrangement, even when either one of respective fan modules 400 interrupts its operation due to an obstruction or the like, it is possible by use of the remaining fan module 400 to send cooling winds to both of the upper and lower control modules 700.

Note here that a flow path system which is made up of the duct member 300's each inflow port 311, 312, 321, 322 and each flow path 350, 360 plus each outflow port 330, 340 is designed to have a shape which ensures that the cooling wind from each fan 410, 420 flows smoothly and hardly flows backward from the chassis 100 side.

Figure 8:
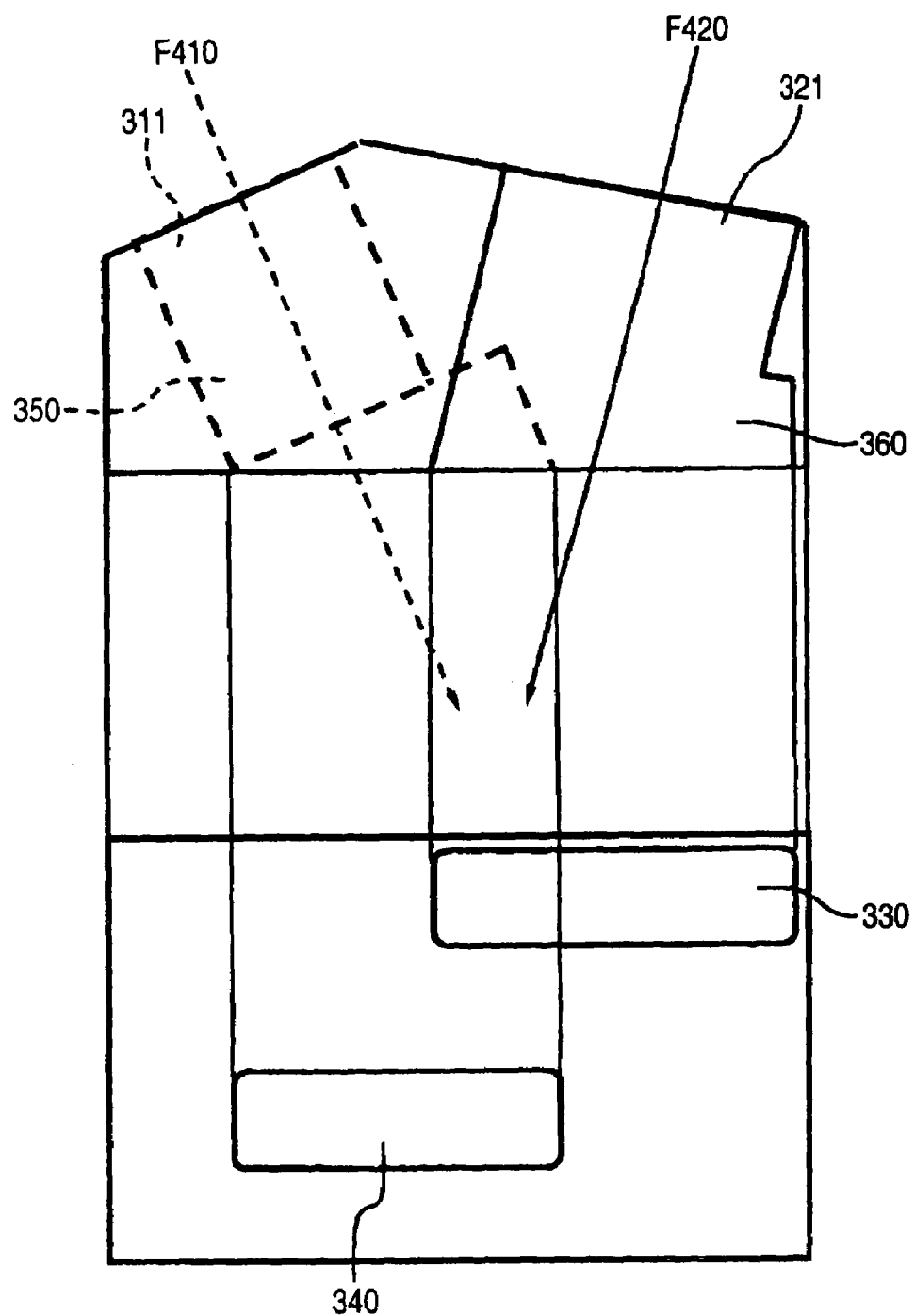
FIG. 8 is a projection drawing of part of the duct member.

As described above together with FIG. 5, since each fan 410, 420 of each fan module 400 is designed so that the direction of exhaust air faces the central direction, it is possible to form the duct member 300 to have a small size as shown in FIG. 8. Additionally the upper-side outflow port 330 and lower-side outflow port 340 are formed so that these partly overlap at the rear face of duct member 300. This also contributes to downsizing or miniaturization of the duct member 300.

Figure 9A:
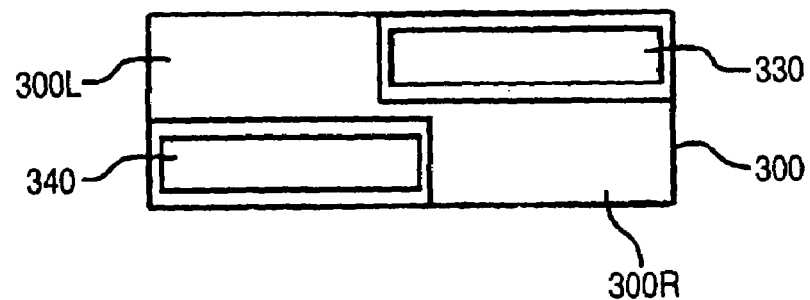
FIGS. 9A to 9C are diagrams showing respective views of part of a dividable structure of the duct member.
Figure 9B:
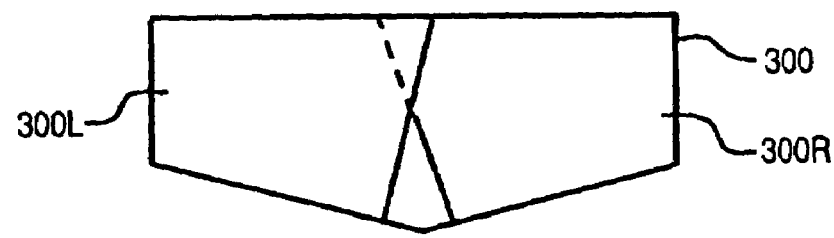
Figure 9C:
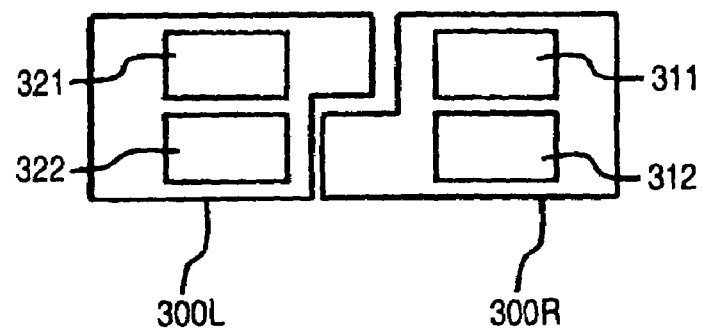

An explanation will next be given of a dividable structure of the duct member 300 with reference to FIGS. 9A to 9C. FIGS. 9A–9C show portions of projection drawings of the duct member 300, wherein FIG. 9A is a back view, FIG. 9B is a top plan view, and FIG. 9C is a front view. As previously stated, the flow path 350, 360 is formed within the duct member 300, for combining together the cooling winds from respective inflow ports 311, 312 on one side and for guiding a combined wind to the lower-side outflow port 340 while combining together the cooling winds from respective inflow ports 321, 322 on the other side to guide a combined wind to the upper-side outflow port 330. Additionally these flow paths 350, 360 are designed so that each has a specific shape which facilitates the flow of a cooling wind from each fan module 400 and prevents reverse flow from inside of the chassis 100.

Accordingly the flow path 350, 360 is relatively complicated in shape. In view of this, the duct member 300 is arranged to have a laterally two-dividable structure. More specifically, the duct member 300 is structured from a one-side divided body 300R shown on the right side in FIG. 9 and an other-side divided body 300L shown on the left side. By letting these divided bodies 300R, 300L be airtightly joined together (it is not always necessary for them to have strict air tightness), each flow path 350, 360 is formed. Thus it is possible to easily form the flow path 350, 360 even when having complicated shapes. Note that although in FIG. 9 a certain case where the duct member 300 is divided into two portions in the right-and-left direction (in the lateral width direction) is shown as an example, the invention is not limited thereto and may be arranged so that the duct member is divided in another direction such as an up/down direction and further is dividable into three or four portions. However, an increase in division number results in increases in parts management costs and in assembly costs or else.

8. Structure of Back Board

Figure 10A:
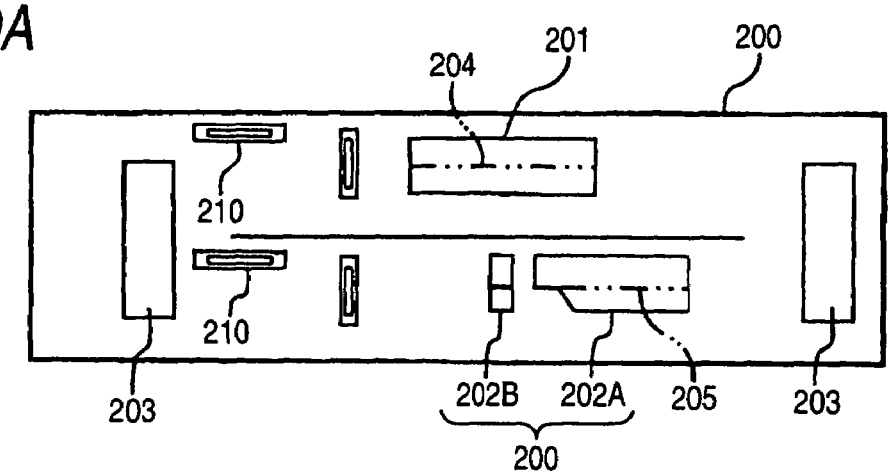
FIG. 10A is a front view of a back board.
Figure 10B:
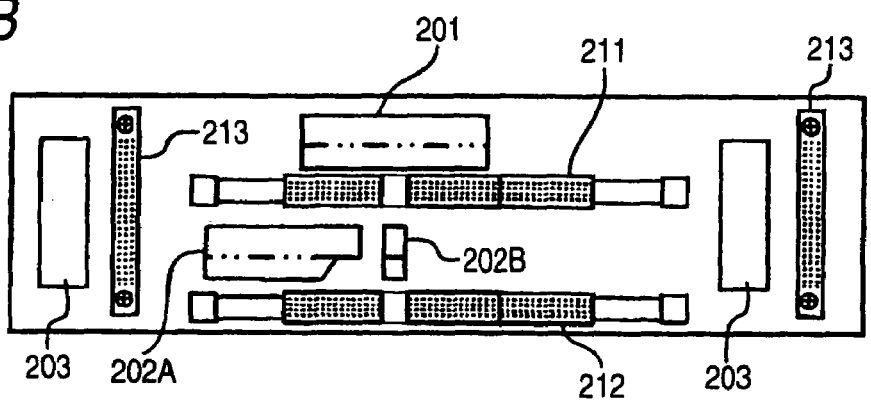
FIG. 10B is a rear view of the back board; and, FIG. 10C is an enlarged view of part of the back board.
Figure 10C:
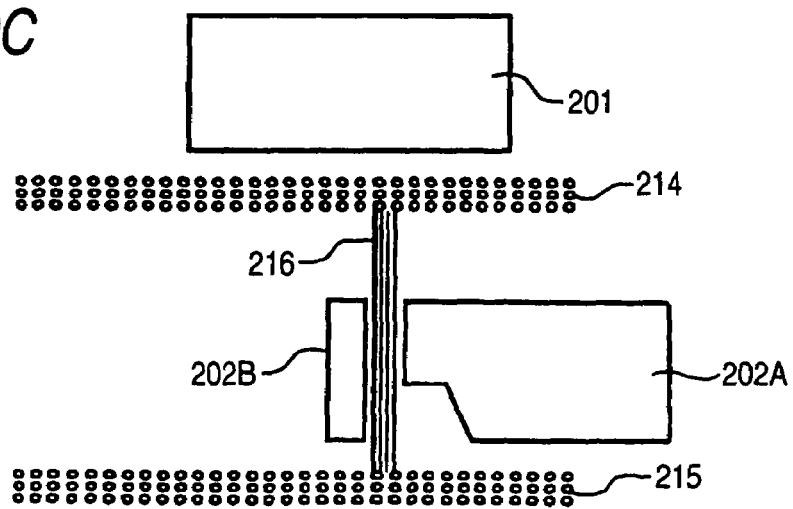

An explanation will next be given of a detailed structure of the back board 200 based on FIGS. 10A to 10C. FIG. 10A is a front view, FIG. 10B is a back view, and FIG. 10C is an enlarged diagram of part of FIG. 10A. The back board 200 is formed for example as a printed circuit board or substrate with an almost flat plate-like shape. An upper-side opening 201 with a rectangular shape corresponding to the upper-side control module 700U is formed in a lateral direction (horizontal direction) on the upper side of the back board 200, whereas a lower-side opening 202 with a rectangular shape corresponding to the lower-side control module 700L is formed laterally on the lower side of back board 200. More precisely, the lower-side opening 202 consists essentially of two opening portions: a large opening 202A having a large area, and a small opening 202B formed to have a small area. It will be called the lower-side opening 202 as a whole. Here, the upper-side opening 201 and lower-side opening 202 are formed in parallel while being offset in the lateral direction. The area of each opening 201, 202 is set at substantially the same value to ensure that a difference between up/down wind amounts does not become larger.

Additionally, a wind direction adjustment plate 204 is provided at the upper side opening 202; another wind direction adjuster plate 205 is provided at the lower side opening 202. These wind plates 204, 205 are each used to change the direction of a cooling wind that tends to flow upward to a downward direction to thereby guide a sufficient amount of cooling wind to the lower-side control circuit board 720 also, which lies on a lower side within each control module 700. Note that it is not always necessary to provide each wind plate 204, 205 at the back board 200 and may alternatively provide it at the outflow port 330, 340 of duct member 300.

Rectangular side openings 203 which extend in the up/down direction are respectively formed on both of the right and left sides of the back board 200. Each side opening 203 is the one that causes each front side duct 104 of the chassis 100 to communicate with the inside space of each power supply module 900.

As shown in FIG. 10A, connectors 210 are provided on the front face of the back board 200 at positions corresponding to the battery modules 500, respectively. In addition, as shown in FIG. 10B, there are provided on the rear face of the back board 200 an upper-side connector 211 which is connected to terminals of the upper-side control module 700U, a lower-side connector 212 that is connected to terminals of the lower-side control module 700L, and a side connector 213 being connected to each power supply module 900. A wiring pattern is formed at back board 200, for providing required electrical connections between respective connectors.

As shown in FIG. 10C, a pad group 214 to which the upper-side connector 211 is attached and a pad group 215 to which the lower-side connector 212 is attached are such that predetermined terminals are connected together via a wiring pattern. Here, a wiring pattern 216 for connection between certain terminals of respective pad groups 214, 215 is formed in a gap space between a large opening 202A and a small opening 202B, which constitute the lower-side opening 202. This wiring pattern 216 is the one that was formed, for example, in order to allow each control module 700 to perform high-speed data communications via a fiber channel or the like. More specifically, the wiring pattern 216 that is formed in the gap between the large opening 202A and small opening 202B is used to transmit a preferable electrical signal(s) by using a shorter wiring length.

Since it is required in order to stably perform high-speed signal transmission that the wiring length be minimized to maximally reduce the influences of the impedance and stray capacitance or noise or else, the lower-side opening 202 is divided into the large opening 202A and small opening 202B in order to shorten the wire length of the wiring pattern 216 used for such signal transmission. Note that although only the wiring pattern 216 is shown in the drawing, the upper-side pad group 214 and lower-side pad group 215 are connected together by another wiring pattern, not shown, when the need arises.

9. Structure of Control Module

Figure 11A:
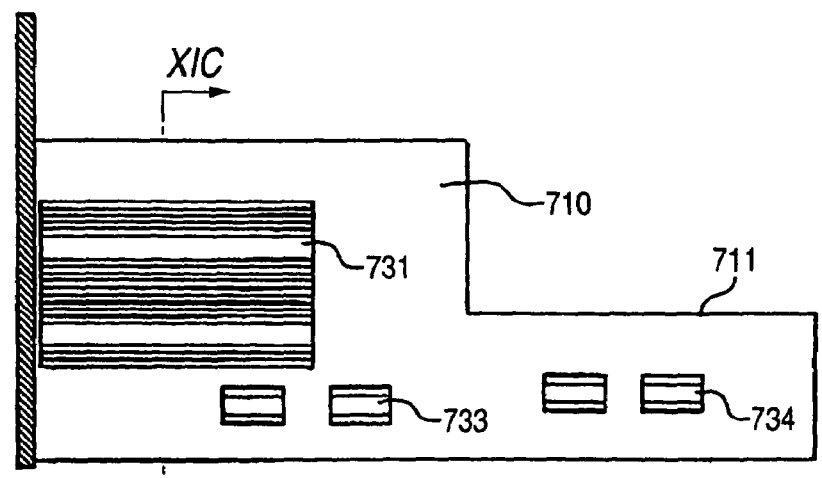
FIG. 11A is a top plan view of an upper side control circuit board.
Figure 11B:
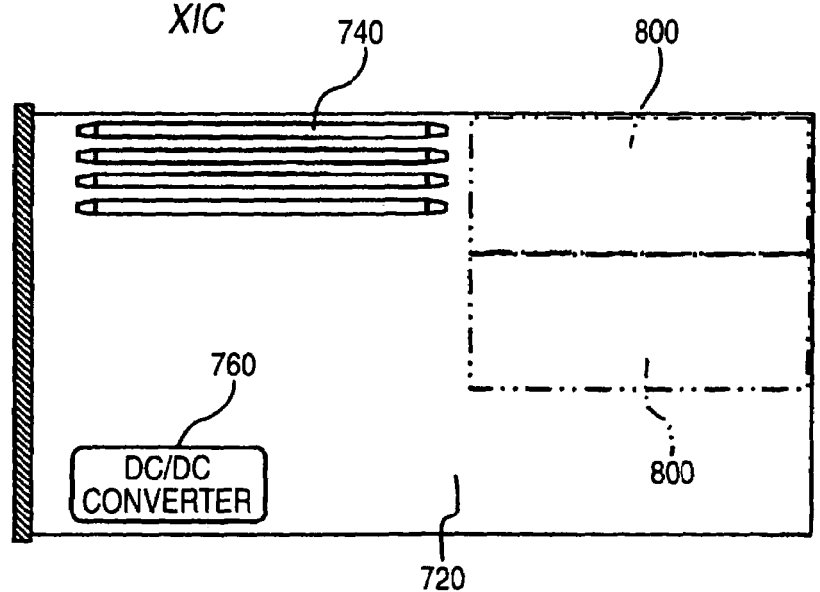
FIG. 11B is a plan view of a lower side control board.
Figure 11C:
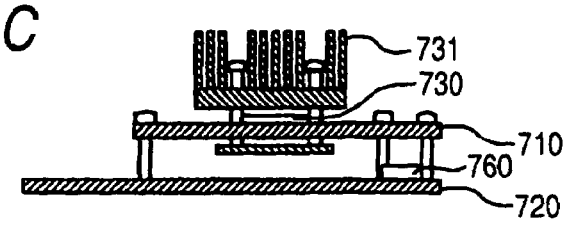
FIG. 11C is a cross-sectional view in an arrow-indicated direction XIC—XIC.

An explanation will be given of the structure of each control module 700 with reference to FIGS. 11A–11C and 12. First, refer to FIGS. 11A–C showing an arrangement of each control circuit board 710, 720 within the control module 700. FIG. 11A is a plan view of the upper-side control board 710, FIG. 11B is a plan view of lower-side control board 720, and FIG. 11C is a cross-sectional view when viewing from an arrow-indicated direction B—B in the state that respective control boards 710, 720 are assembled and attached above and below.

As shown in FIG. 11A, the upper-side control board 710 mounts thereon an MPU 730 being placed at a location near the front side to be attached to the back board 200 along with other electronic components 733, 734 and the like. A cutaway portion 711 for attachment of each I/F module 800 is formed on the rear side of upper-side control board 710. Here, a heat sink 731 (see FIG. 1C) for cool down of the MPU 730 and other electronic parts (for example, IC, LSI, etc.) 733, 734 are laid out in a longitudinal direction, along the direction of a cooling wind which flows in from the back board 200 side. Note however that all the electronic parts are not needed to be disposed along the flow of cooling wind; alternatively, some major parts that can affect the flow of cooling wind, such as the heat sink 731 and/or cache memory 740 or else, are disposed almost in parallel with the flow of cooling wind, thereby enabling the cooling wind to flow smoothly.

As shown in FIG. 11B, the lower-side control board 720 is formed into a rectangular flat plate-like shape having a larger area than the upper-side control board 710, wherein a cache memory 740 and DC-to-DC converter 760 are mounted thereon. In addition, the lower-side control board 720 is arranged so that each I/F module 800 is attached to its rear side in a way corresponding to the cutaway portion 711 of upper-side control board 710.

Here, the cache memory 740 is comprised of, for example, a double data rate synchronous dynamic random access memory (DDR-SDRAM) or the like, which is attached so that it is projected upwardly from a side edge on the other side of the upper-side control board 710 and is attached in such a manner as to become almost in parallel with the flow of a cooling wind—that is, in parallel with the long-side direction of the control module 700. In other words, attaching the heat sink 731 and other electronic parts 733, 734 along with the cache memory 740 and DC/DC converter 760 substantially in parallel with the long-side direction of the control module 700 rectifies the cooling wind that has flown into the control module 700 and forces it to flow toward the rear part of control module 700. In particular, it is the heat sink 731 that is expected to offer the cooling wind rectification effect, the heat sink being placed near the cooling wind inflow port.

On the other hand, the DC/DC converter 760 is positioned adjacent to the back board 200 and is attached to the lower-side control circuit board 720. The first reason of this is that the DC/DC converter 760 is a heating element comparable to MPU 730 so that letting it be disposed near the cooling wind inflow port provides effective cooling capabilities. The second reason is in order to shorten the line length of a high-voltage input being input to the DC/DC converter 760.

More specifically, the DC/DC converter 760 is the one that converters a high-voltage input (e.g., DC 54V), which is input from the power supply module 900 through the wiring pattern of the back board 200 and the wiring pattern of lower-side control board 720, into a low-voltage output (e.g. DC 3.3V) and then supplies it to each certain part. Accordingly, if an attempt is made to mount the DC/DC converter 760 on the lower-side control board 720 at a location distant from the back board 200, then the distance of from back board 200 to DC/DC converter 760 becomes longer, resulting in an increase in distance of the flow of a current of high voltage on the lower-side control board 720. This is not preferable in a view point of noises or else. Consequently in this embodiment, the length of the high-voltage input line is shortened by mounting DC/DC converter 760 on the back board 200 side.

Additionally, an arrangement is also conceivable which causes a prespecified low voltage to output from each power supply module 900 by way of example; however, in this case, the length of a power supply line increases, which leads to the MPU 730 and electronic parts 733, 734 that are loads. Thus, there is the possibility that voltage drop or the like takes place on the power supply line, although it differs depending upon power consumption or else. Then, in this invention, the DC/DC converter 760 is mounted within a respective one of the control modules 700 to thereby shorten the power supply line also. In addition, since it possible by disposing the DC/DC converter 760 near the load to deal with an increase in consumed current, it is possible to keep track of improvements in performance of MPU 730. Further, low current input is enabled by increasing the input voltage at about 54 volts (V) for example, which makes it possible to reduce the number of power supply pins of the connectors.

Figure 12:
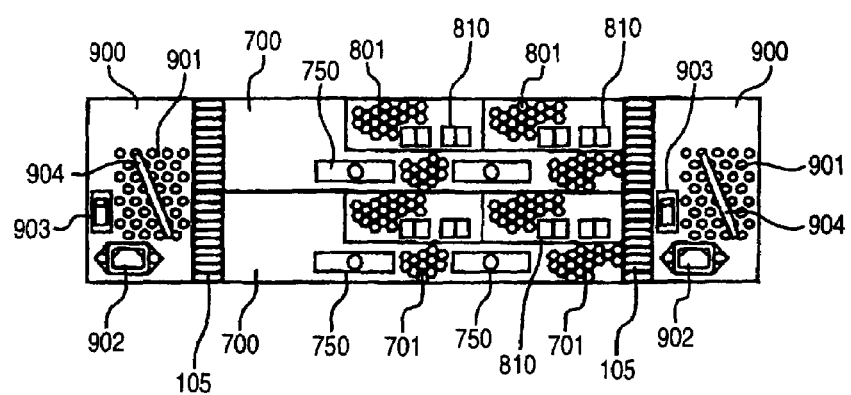
FIG. 12 is a rear view of a control unit 30.

FIG. 12 is a back view of the control unit 30. Power supply modules 900 are detachably attached to the both sides of each of up/down-stacked control modules 700, respectively. A great number of ventilation holes 701 are formed on the rear side of each control module 700. In addition, a great number of ventilation holes 801 are formed on the rear side of each I/F module 800 also.

Two upper-level I/F units 750 each of which is connectable to a host computer are provided on the rear side of each control module 700 in such a manner as to underlie each I/F module 800. Provided on the rear side of each I/F module 800 are lower-level I/F units 810 for connection to respective hard disk units 20.

On the other hand, ventilation holes 901 and a power supply connector 902 to which commercial power of AC 100V or the like is input for example along with a power switch 903 and a handle 704 are provided on the rear side of each power supply module 900. As previously stated, the rear side duct 105 is formed between each power supply module 900 and each control module 700.

Also note that each I/F 750 is disposed in conformity with the flow of a cooling wind within the control module 700 in such a manner as to lie on the other side (left side) when looking down the control module 700 from its upper direction.

10. Cooling Air Flow on Each Control Board

Figure 13A:
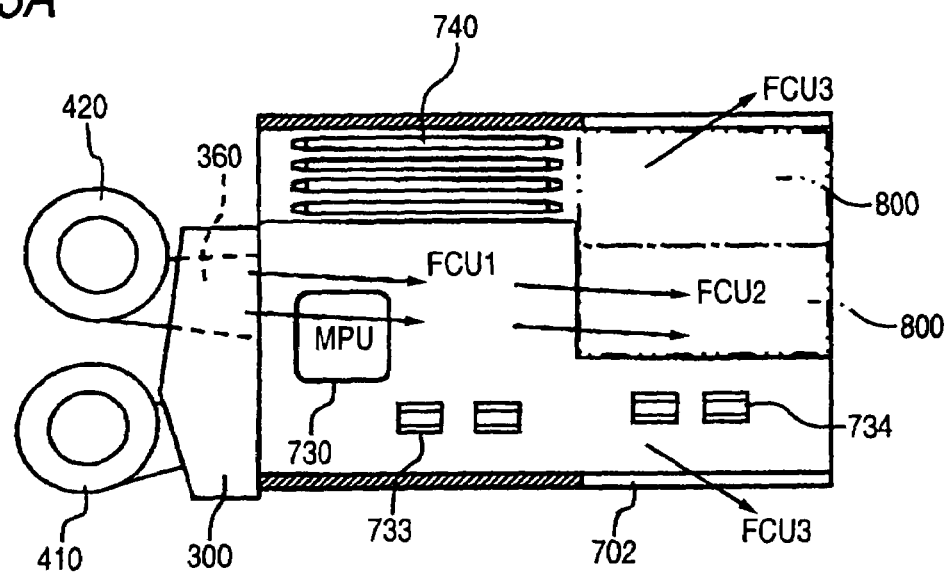

Next, an explanation will be given about a cooling air stream or "wind" which flows on or above each control module 700U, 700L with reference to FIGS. 13A–13B. FIG. 13A shows a cooling wind which flows above the upper-side control module 700U, and FIG. 13B shows a cooling wind flowing above the lower-side control module 700L.

As shown in FIG. 13A, the cooling winds from respective other-side fans 420 of fan modules 400 are combined and mixed together within the flow path 360 of duct member 300 and then flow into the upper-side control module 700U from the upper-side outflow port 330 in a direction slightly tilted with respect to the longitudinal direction of control module 700. This inflow cooling wind FCU1 cools down the MPU 730 or the like as disposed near the outflow port 330 and is rectified by the heat sink 731 and/or cache memory 740 or else and then reaches an intermediate portion of the upper-side control module 700U in the longitudinal direction. A cooling wind FCU2 that has reached the almost intermediate portion of upper-side control module 700U cools down peripheral electronic components 734 or the like, part of which wind goes straight and is then exhausted to the outside from the ventilation holes 701 that are formed on the rear side of control module 700U. The remaining part of the cooling wind FCU2 flows into each rear side duct 105 through the vent holes 702 that are formed on the both sides of the rear face of upper-side control module 700U respectively and is then exhausted externally from each rear side duct 105.

Figure 13B:
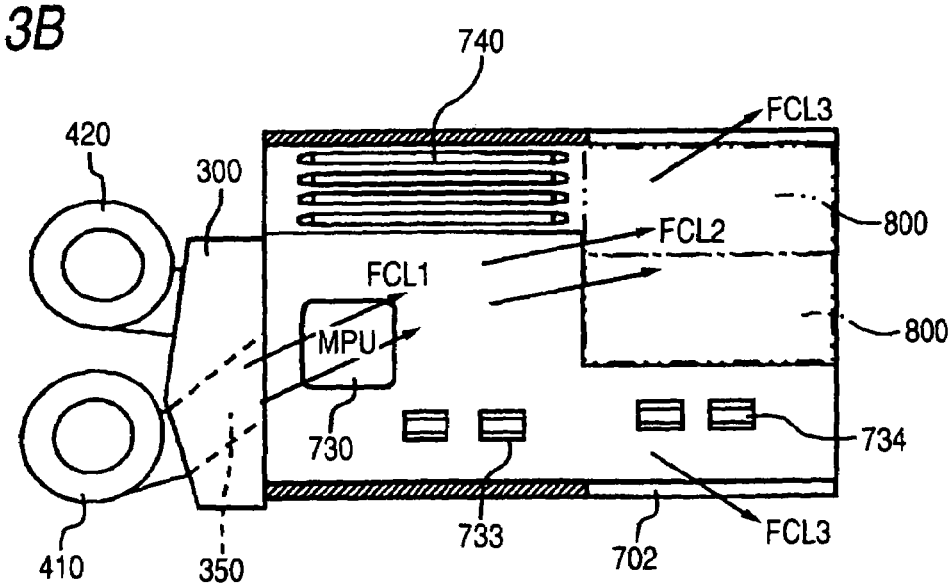

As shown in FIG. 13B, the cooling winds from respective one-side fans 410 of the fan modules 400 are combined together within the flow path 350 of duct member 300 and then flow into the lower-side control module 700L from the lower-side outflow port 340. A cooling wind FCL1 which is immediately after outflow from lower-side outflow port 340 flows into lower-side control module 700L in a direction tilted to a one-side direction with respect to the longitudinal direction of lower-side control module 700L and then cools down the MPU 730 or the like, followed by rectification of its flow in a way similar to the above-noted case. In a similar way to the above case, a cooling wind FCL2 which has reached an almost intermediate portion of the lower-side control module 700L behaves so that its part is exhausted to the outside through the vent holes 701 of lower-side control module 700L while the remaining part flows into the rear side duct 105 through side-face vent holes 702 and is exhausted to the outside.

11. Hot Insertion Rush Preventing Circuit

An explanation will next be given of a circuit for preventing a rush current occurring in active line or "hot" insertion events. Each control module 700 in accordance with this invention is arranged to offer hot plug/unplug capabilities to thereby permit users to perform maintenance works or the like while the disk array apparatus 1 is made active. Accordingly, each control module 700 is required to prevent rush currents in hot insertion events. For use as the rush prevention circuit, it comprises a circuit shown in FIG. 14A or 14B.

Figure 14A:
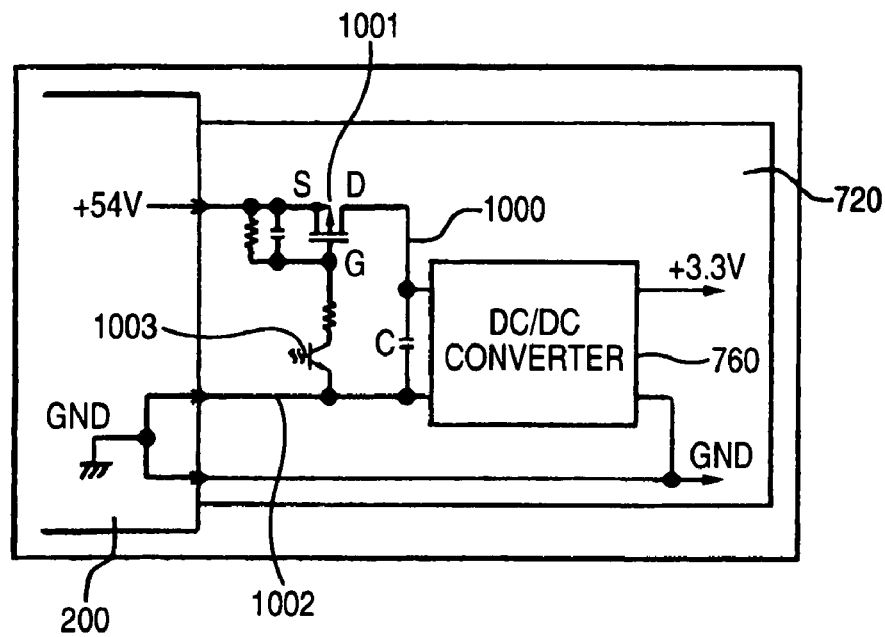

FIG. 14A shows one example of the rush prevention circuit. This circuit uses a PMOSFET 1001 to suppress a rush current with respect to an electrostatic capacitor C between 54V and ground (GND) at the time of hot insertion of a controller. Note here that PMOSFET refers to a P-channel metal oxide semiconductor field effect transistor. The PMOSFET is such that when a negative voltage is applied to its gate terminal G, a resistance value between a source terminal S and drain terminal D changes due to a potential difference between the gate terminal G and source terminal S, thereby making it possible to control the value of a source-drain current.

As shown in FIG. 14A, the PMOSFET 1001 is provided at a portion of a power supply line 1000 of 54V extending from the back board 200. A transistor 1003 is provided between the gate terminal G of PMOSFET 1001 and a ground line 1002.

An operation of the circuit shown in FIG. 14A will be explained. (1) First, insert the terminals of control module 700 into the connector 211 (or 212) of back board 200 and then mate them together. At this time, the source terminal S and gate terminal G of PMOSFET 1001 are at the same potential level. (2) Next, set the transistor 1003 being connected to the gate terminal G of PMOSFET 1001 in a turn-on state. When applying a negative voltage to the gate terminal G, this terminal gradually decreases in potential. (3) With such a potential decrease of the gate terminal G, the resistance value between the source terminal S and drain terminal D also decreases gradually, causing the capacitor C to be charged up. (4) At a point whereat the resistance value between the source terminal S and drain terminal D becomes almost zero, let the gate terminal G stay at a fixed potential level. With such an operation, it is possible to prevent any rush current relative to the electrostatic capacitor C lying between the power line 1000 and ground line 1002, which are coupled to inputs of the DC/DC converter 760 respectively.

Figure 14B:
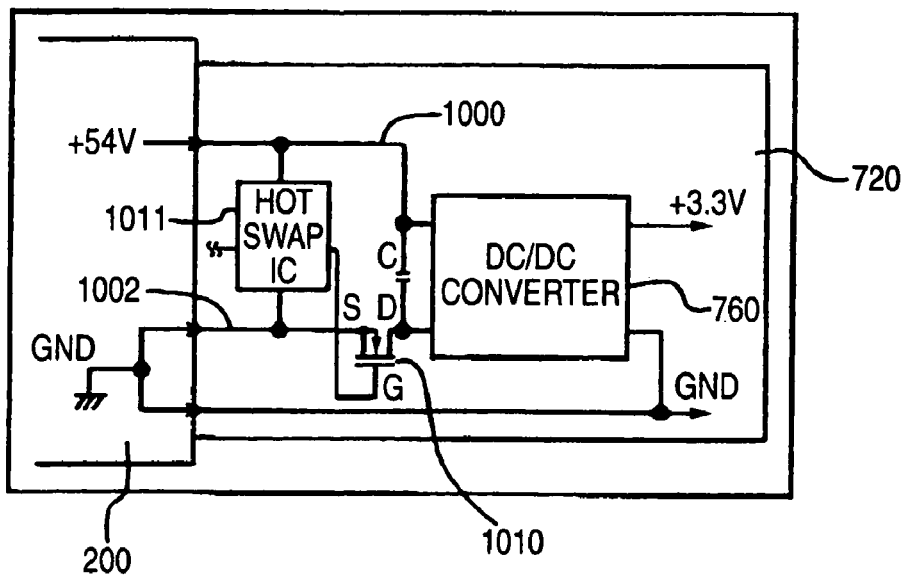

Next, FIG. 14B is another example of the rush prevention circuit. This circuit uses an N-channel MOSFET (NMOSFET) 1010 and a hot swap-use IC 1011 for driving the NMOSFET 1010. Here, the NMOSFET 1010 is the MOSFET that changes in source-drain resistance value depending upon a potential difference between its gate terminal G and source terminal S. NMOSFET 1010 is such that when the gate terminal G and source terminal S are at the same potential level, the gate-source resistance value becomes almost infinite. Additionally at NMOSFET 1010, as the potential of gate terminal G becomes higher than that of source terminal S, the source-drain resistance value becomes smaller.

As shown in FIG. 14B, the NMOSFET 1010 is provided partway on a ground line 1002 connected to the DC/DC converter 760. An IC 1011 for hot swap use is provided between the gate terminal G of NMOSFET 1010 and the power line 1000.

An operation of the circuit shown in FIG. 14A is as follows. (1) First, insert the terminals of control module 700 into the connector 211 (or 212) of backboard 200 and then mate them together. At this time, the source terminal S and gate terminal G of NMOSFET 1010 are at the same potential level. (2) Next, the hot swap IC 1011 causes a positive voltage being applied to the gate terminal G of NMOSFET 1010 to increase gradually. (3) Whereby, the resistance value between the source terminal S and drain terminal D gradually decreases, permitting the capacitor C to be charged up. (4) At a point at which the resistance value between the source terminal S and drain terminal D becomes almost zero, the hot swap IC 1011 retains the potential of gate terminal G at a constant level. By adjustment of the operation of NMOSFET 1010 provided to ground line 1002 in this way, it is possible to preclude any rush current relative to the electrostatic capacitor C between the power line 1000 and ground line 1002, which are input to the DC/DC converter 760.

As N-channel transistors are generally better in performance than P-channel ones, this embodiment employs the circuit shown in FIG. 14B. However, the invention is not limited thereto and may alternatively employ the P-channel MOSFET shown in FIG. 14A.

12. Input Voltage Monitor Circuit

Figure 15:
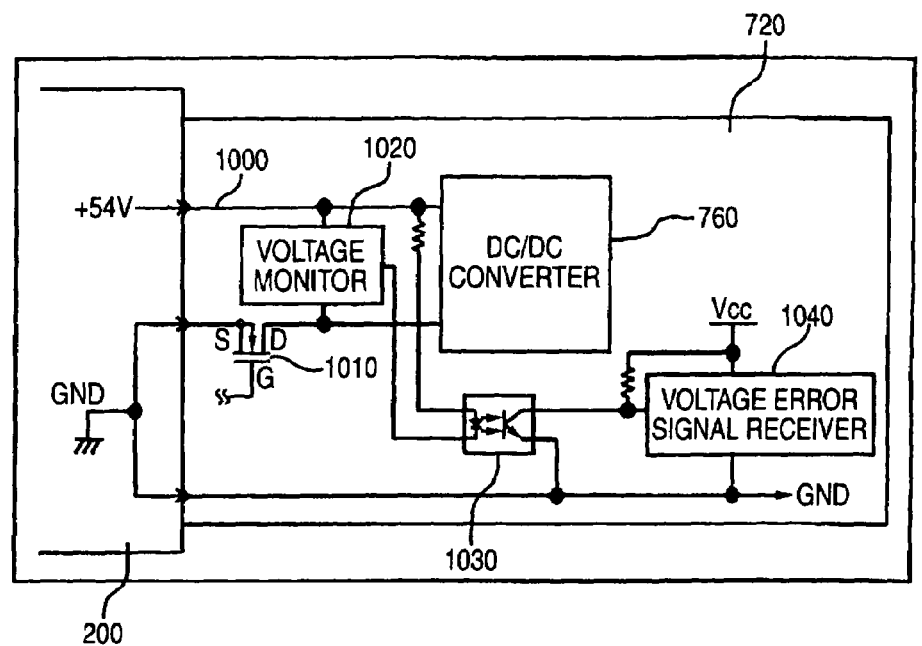
FIG. 15 shows a configuration of a voltage monitor circuit for monitoring an input voltage(s) to a DC-to-DC converter.

Next, based on FIG. 15, an explanation will be given of an input voltage monitor circuit for monitoring input voltages to the DC/DC converter 760.

A voltage monitor circuit 1020 is provided between the power supply line 1000 of 54V and the ground line 1002 which are coupled to inputs of the DC/DC converter 760 respectively, for monitoring to determine whether an obstruction occurs at the input voltage stop DC/DC converter 760. In case an obstruction occurs at the input voltage(s) to DC/DC converter 760, this obstruction is detected by the voltage monitor circuit 1020; then, an obstruction detection signal is output as a current signal from voltage monitor circuit 1020. This current signal from voltage monitor circuit 1020 is input to a photo-coupler 1030 and is then converted by photocoupler 1030 into a voltage signal. This obstruction detection signal thus converted to the voltage signal is input to a voltage obstruction signal receiving circuit 1040. Note here that the photocoupler 1030 is provided because a reference voltage (54V) of the voltage monitor circuit 1020 and a reference voltage (Vcc) of voltage obstruction signal receiver circuit 1040 differ from each other.

13. Fan Module Control

Based on FIG. 16, a control method of each fan module 400 will be explained. As has been stated supra, the control unit 30 in accordance with the invention employs two fan modules 400 each having two built-in fans 410, 420 and causes each fan module 400 to cool down two control modules 700. Moreover, the duct member 300 is used to permit each one-side fan 410 of each fan module 400 to cool down the lower-side control module 700 while letting each other-side fan 420 of each fan module 400 cool the upper-side control module 700. Thus it has redundancy with the capability which follows: even where either one of the fan modules 400 stops its operation due to an obstruction or the like, the other fan module 400 with proper operability is used to cool the upper and lower control modules 700. In addition, since the duct member 300 is designed so that the flow path shape or else is set to facilitate the flow of a cooling wind from each fan module 400, the air sending efficiency is high. Thus, even when one fan module 400 interrupts its operation, it is possible to retain an airflow amount of about 60 to 70% by use of the other fan module 400.

In addition to these mechanical arrangements, this invention has a further feature for increasing, when one fan module 400 stops its operation, the drive voltage of the other fan module 400 to thereby enhance the cooling airflow amount.

Figure 16:
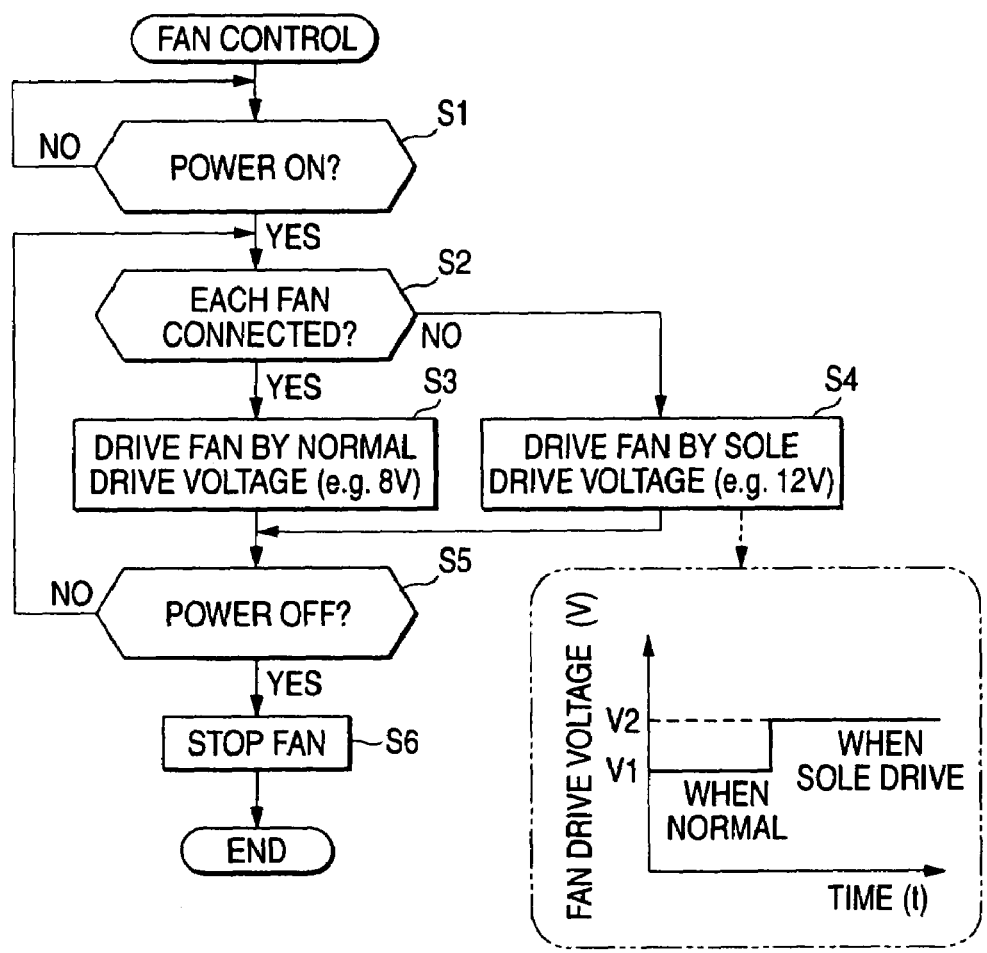
FIG. 16 is a flow chart showing a routine of fan drive voltage control processing.

A flow chart shown in FIG. 16 indicates the processing for control of the drive voltage to be applied to each fan module 400. Note that the drive voltage control processing shown in FIG. 16 may be arranged as a software program to be executed by a microcomputer or alternatively configured from hardware logic circuitry.

When the power supply of the control unit 30 turns on (YES at step S1), determine whether two fan modules 400 are connected to the control unit 30 (at step S2). In case two fan modules 400 are connected together (YES at S2), use a drive voltage V1 (for example, V1 is about 8V) for normal event use to activate each fan module 400 (S3). When the power supply is turned off (YES at S5), force each fan module 400 to stop its operation (S6). Optionally the operation interruption of fan module 400 may be delayed so that fan module 400 becomes inoperative after the elapse of a specified length of time from a time point of power-off.

On the other hand, in case any one of the two fan modules 400 interrupts due to some kind of cause and the malfunctioned fan module 400 is removed away, the judgment of "NO" is issued at step S2; then, go to step S4. At S4, set up a drive voltage V2 for the remaining fan module 400 with proper operability so that this voltage is higher than the drive voltage V1 for normal event use (for example, V2 is set at about 12V, where V2>V1). Whereby, each fan of the normal fan module 400 increases in rotation number, resulting in an increase in amount of cooling airflow or "wind." Thus it is possible to continue the cool-down of each control module 700 by use of a single fan module 400.

14. Effect of the Embodiment

Since this embodiment is arranged as has been described above in detail, it offers the following effects and advantages.

First, owing to the arrangement that provides two fan modules 400 each having two fans 410, 420 corresponding to the upper and lower-side control modules 700 respectively, it is possible during normal operations to use two fan modules 400 to effectively cool down the two control modules 700. Even when either one of the fan modules 400 stops its operation, it is still possible to continue cool-down of each control module 700 by use of the remaining, properly operable fan module 400. With such redundancy feature of the cooling wind supply mechanism, it is possible to attain the reliability in obstruction occurring events.

In addition, since the duct member 300 is designed to have a specific shape that prevents reverse flow from inside of the chassis 100, it is possible to perform effective cool-down during normal operations. Moreover, even in the case of a sole operation with a single fan module 400, the wind amount is hardly half-reduced. Thus it is possible to continue effective cool-down and maintain the reliability required.

Furthermore, at the time of a sole operation (upon occurrence of an obstruction) by means of either one of the fan modules 400, the drive voltage to fan module 400 potentially increases to V2 which is higher than the drive voltage V1 during normal operations. Thus it is possible to enhance the air blow power to thereby increase the amount of cooling air steam or "wind." This makes it possible to attain further increased reliability in obstruction occurrence events.

As each exhaust port 412, 422 of each fan module 400 is designed to face the center direction, it is possible to downsize not only each fan module 400 but also the duct member 300.

As each fan module 400 employs the fans 410, 420 with the same structure, it is possible to reduce parts management costs and manufacturing costs or the like.

Furthermore, since each fan 410, 420 is formed of a lateral flow type fan (e.g. sirocco fan) capable of sucking air from its axial direction and exhausting it in radial direction, it is possible to obtain a large amount of air flow while having a relatively small size. It is also possible to prevent reverse flow from inside of the chassis 100.

Next, because the duct member 300 is provided which causes each one-side inflow port 311, 312 to communicate with the lower-side outflow port 340 while letting each other-side inflow port 321, 322 communicate with the upper-side outflow port 350, it is possible to permit each fan module 400 to cool down two control modules 700.

Additionally, since the duct member 300 is designed to have a dividable structure, it is possible to readily manufacture the flow paths 350, 360 having complicated shapes.

Further, since the duct member 300 is made of a relatively easily moldable material such as plastic foamed material or equivalents thereto with its surface coated with resin material or the like, it is possible to easily fabricate the duct member 300 having a complicated shape while making it possible to prevent unwanted creation of ducts or else from the surface.

Next, as the back board 200 is provided with the openings 201, 202 corresponding to respective control modules 700, it is possible to supply the cooling wind from each fan module 400 to each control module 700.

In addition, as the lower-side opening 202 is divided into the large opening 202A and small opening 202B with the wiring pattern 216 for performing high-speed data communications being formed in a gap space between these openings 202A and 202B by way of example, it is possible to transmit electrical signals with high reliability while shortening the wire length.

Further, the wind direction adjusting plates 204, 205 for guiding the direction of cooling winds downwardly are provided at the openings 201, 202 of back board 200 respectively, it is possible to effectively cool down by sending a cooling wind to a gap space between the upper-side control circuit board 710 and the lower-side control board 720 of each control module 700.

Next, each control module 700 is disposed to mount the MPU 730 and DC/DC converter 760 serving as heating bodies at locations near the openings 201, 202 of back board 200, which are gateways of cooling winds. Thus it is possible to effectively cool down.

In addition, since the DC/DC converter 760 is mounted at a specified position near the backboard 200 side, it is possible to shorten the wiring length of a high-voltage input line from the power supply module 900 on the lower-side control board 720.

Additionally, as the DC/DC converter 760 is mounted within each control module 700 on which respective electronic parts acting as loads are mounted, it is possible to prevent any voltage drop at the power supply line 1000 and enlargement of the power connectors. This makes it possible to deal with an increase in current consumption.

Furthermore, as respective parts including but not limited to the MPU 730 with heat sink 731 and the cache memory 740 plus the DC/DC converter 760 are laid out in parallel with the long-side direction of the control module 700, it is possible to rectify the cooling wind which has flown into the control module 700.

Additionally, since each upper-level I/F 750 is disposed at a position slightly adjacent to the other side rather than the center line in conformity with the flow of cooling wind within the control module 700, it is possible to more effectively circulate the cooling wind.

Next, as the ventilation holes 502 are formed in the battery module 500 so as to make it possible to supply the inflow air which comes from the front face of battery module 500 to each fan module 400 from the side face of battery module 500, it is possible to supply a large amount of air to each fan module 400.

In addition, because of the arrangement which disposes three battery units 520 each having a serial combination of five batteries 510 within the battery module 500 in parallel with the back board 200, it is possible to lessen a wiring line length difference between respective batteries 510 to thereby enable achievement of equalized charge-up.

Next, the front side ducts 104 are provided on the front side of the back board 200 so that these reside on the both sides within the chassis 100 respectively, for causing the cooling wind from each front side duct 104 to flow into each power supply module 900 through the side opening 203 of back board 200. Thus it is possible to separate the cooling structure of each control module 700 and that of each power supply module 900 from each other. More specifically, in each power supply module 900 that is large in heat generation amount but less in risk of function decrease due to heat-up, the air inlet fan 910 is used to suck a cooling wind from the dedicated front side duct 104; in each control module 700 that is large in partial heat generation amount and must have the risk of function decrease due to heat up, cooling is done by forcibly sending a cooling wind from each fan module 400 through the duct member 300.

Additionally, as the rear side duct 105 is provided between each control module 700 and each power supply module 900, it is possible to avoid transmission of the heat within the power supply module 900 toward the inside of control module 700.

Furthermore, as the ventilation holes 702 for communication with the rear side of each rear side duct 105 are formed on the rear side of each control module 700, it is possible to exhaust the cooling wind within the control module 700 through each rear side duct 105. More specifically, the cooling wind that has flown into each control module 700 is designed to be exhausted to the outside along two routes: the ventilation holes 701 formed in the rear face of each control module 700, and the rear side duct 105. By setting the exhaust area as large as possible in this way, the flow of cooling wind within each control module 700 is smoothened.

As apparent from the foregoing, it is possible to effectively cool down the control unit 30 which is faced with a height limitation of 3U and tends to increase in heat generation amount due to improvements in processing performance. This makes it possible to improve the reliability of control unit 30.

Embodiment 2

Figure 17:
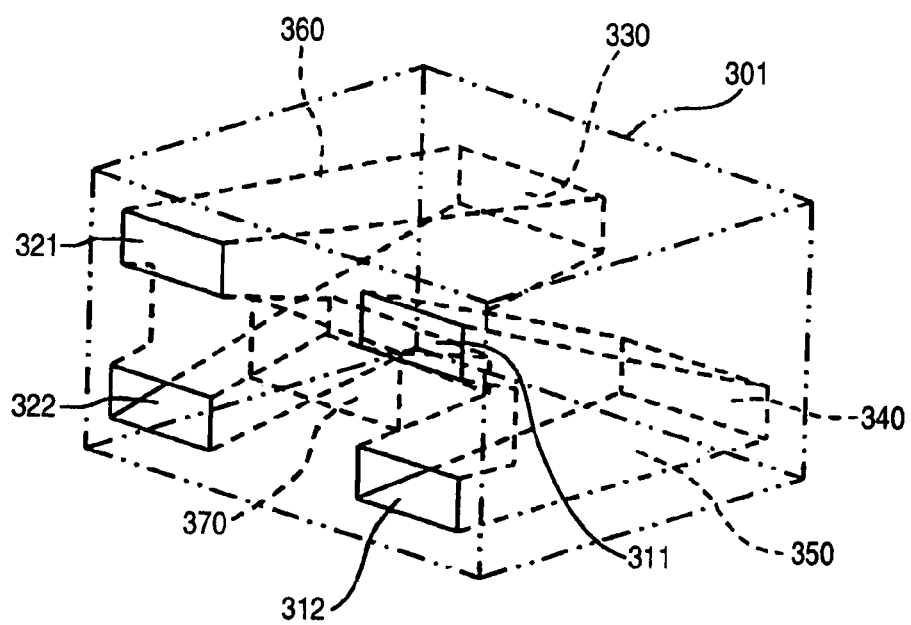
FIG. 17 is a perspective view of the inside structure of a duct member in accordance with a second embodiment of this invention.
Figure 18:
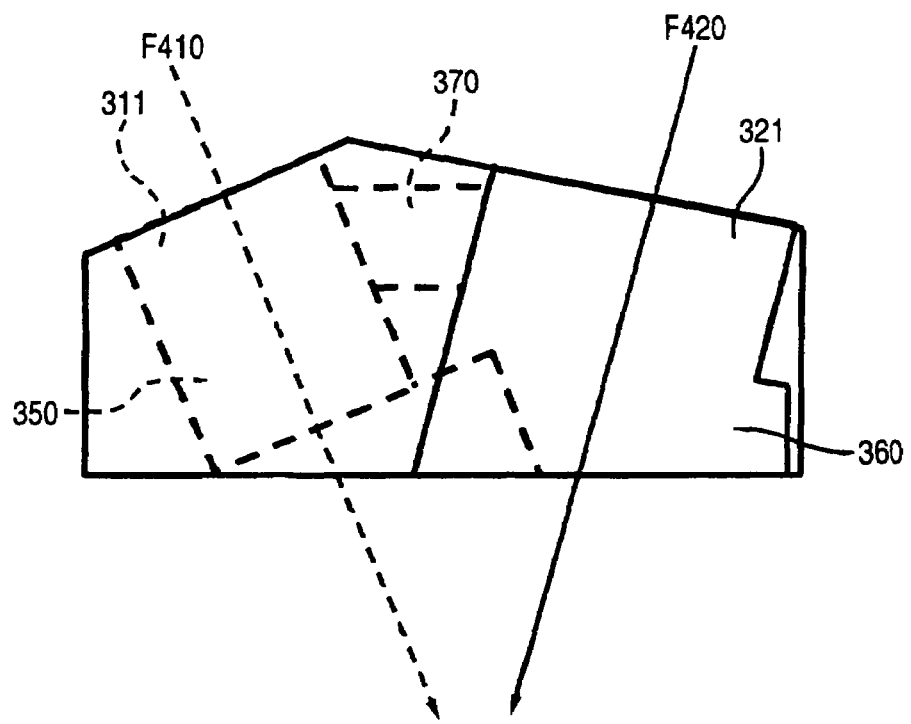
FIG. 18 is a partial projection diagram of the duct member.

A second embodiment of the present invention will be explained with reference to FIGS. 17 and 18. A feature of this embodiment lies in that a confluence passage 370 is provided to couple together the lower-side flow path 350 and the upper-side flow path 360 for communication therebetween. FIG. 17 is a perspective view of an internal structure of a duct member 301 in accordance with this embodiment. Although in FIG. 17 the duct member 301 is shown to have a simplified shape for illustration purposes in order to explain the structure of the internal flow path, it actually has an exterior appearance shown in FIG. 6 and is laterally dividable. FIG. 18 is a projection drawing of part of the duct member 301.

As shown in FIGS. 17–18, the confluence passage 370 is formed within the duct member 301, which passage combines together the lower-side flow path 350 and upper-side flow path 360 for communication therebetween. The confluence passage 370 is positioned on the upstream side (upstream side in the flow of a cooling wind) of each flow path 350, 360 and permit respective flow paths 350, 360 to communicate with each other. One opening (right side in the drawing) of the confluence passage 370 is positioned almost at an intermediate portion between an inflow port 311 and outflow port 312 and opens on the upstream side of lower-side flow path 350. The other opening (left side in the drawing) of the confluence passage 370 is positioned almost midway between inflow port 321 and outflow port 322 and opens on the upstream side of upper-side flow path 360. The confluence passage 370 is formed to become horizontal within the duct member 301, wherein its openings on the both sides have the same shape. The confluence passage 370 can be formed into a hollow trapezoidal columnar shape, for example. More precisely, the confluence passage 370 may be formed to have a hollow trapezoidal shape with a width becoming gradually narrower as it approaches the upstream and downstream sides of a cooling wind flowing within each flow path 350, 360, by way of example. Note that the confluence passage 370 is not limited to the illustrative shape. What is required here is to arrange the confluence passage 370 so that it functions to provide communication between the lower-side flow path 350 and upper-side flow path 360 while allowing circulation of a cooling wind between these flow paths 350, 360. In view of this, any equivalent structures are employable as far as these offer such functions.

As has been stated in the first embodiment, for the purpose of causing the laterally disposed fans 410, 420 to cool down the upper and lower control modules 700 respectively, each flow path 350, 360 is substantially the same in its inflow side position (inflow port formation position); however, the position on the outflow side (outflow port formation position) is separated up and down, resulting in formation of a level difference. Accordingly, when viewing from the side face in FIG. 17, an area in which the flow paths 350, 360 overlap each other becomes less as it comes closer to the downstream side. Hence, in order to enlarge the cooling wind passing area of the confluence passage 370 while letting it have a relatively simple shape, it is preferable to form the confluence passage 370 on the upstream side of each flow path 350, 360.

While each fan module 400 has two fans 410, 420, if either one fan within the same fan module 400 stops its operation due to malfunction or else, the above-stated embodiment experiences a decrease in amount of a cooling wind flowing in a flow path corresponding to such operation-failed fan. As previously stated, although it is arranged to have a structure which facilitates the flow of cooling wind in the flow path 350, 360 and avoids occurrence of any reverse flow while using a technique for increasing the fan drive voltage in fan stop events, it is required in some cases to acquire an increased flow amount whenever either one of the fans stops its operation. Consequently this embodiment is arranged to use the confluence passage 370 to couple respective flow paths 350, 360 together for communication, thereby making it possible to provide adequate backup by the air blow force of the remaining fan with proper operability even when either one fan fails to operate. According to experimentation by the applicant(s), it has been affirmed that when letting a single fan go down, this embodiment is superior than the previously-stated embodiment in that the former is capable of lowering the temperature rise-up of a heating body (MPU 730 or else) to about 5 degrees centigrade.

Embodiment 3

Figure 20A:
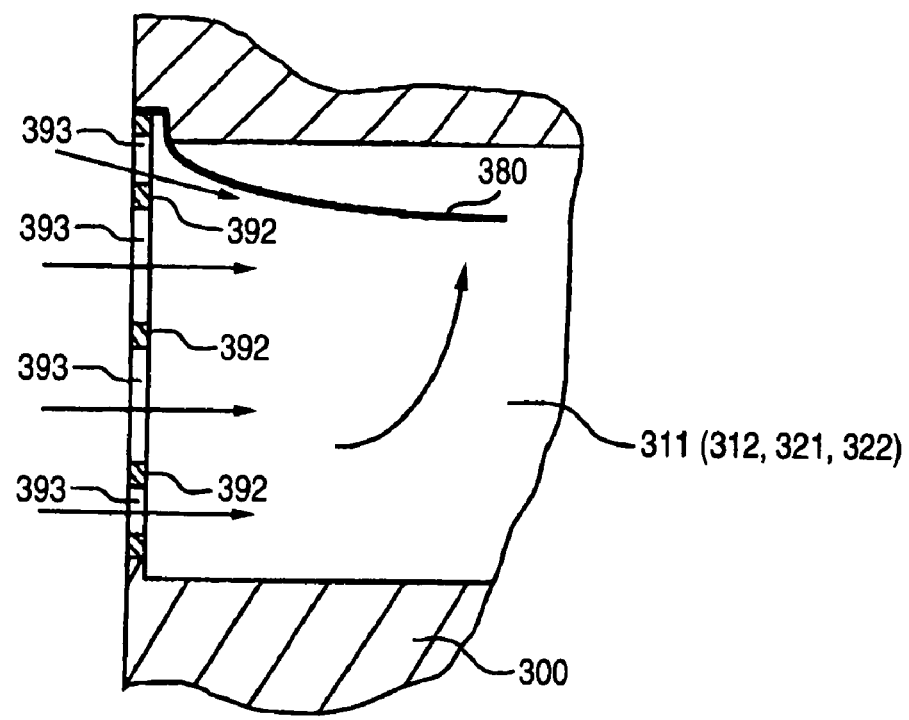
Figure 20B:
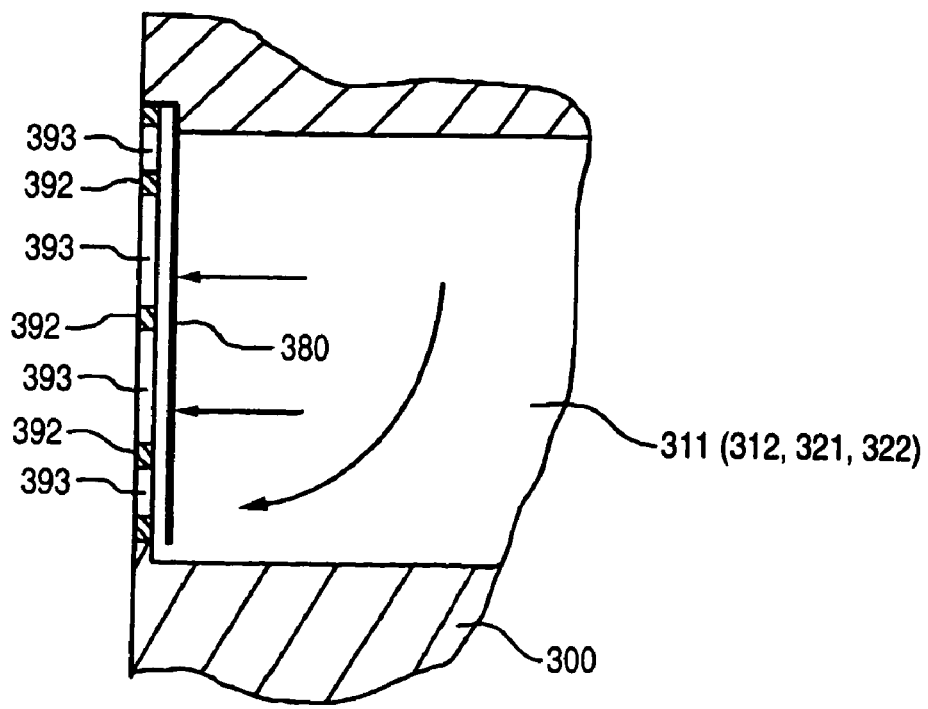

Next, a third embodiment of the invention will be explained based on FIGS. 19A–19B and 20A–20B. A feature of this embodiment is that an open/close valve 380 is provided at a respective one of the inflow ports 311–312 and 321–322 (referred to hereinafter as "inflow port 311 or the like") of the duct member 300 (alternatively, this may be the duct member 301). FIGS. 19A–19B include an illustration showing an enlarged cross-sectional view of the part adjacent to a certain one inflow port. FIGS. 20A–B are diagrams each showing an operation state of the valve 380.

FIG. 19A is a plan view of a stopper member 390 for control of the closed position of the open/close valve 380. The stopper member 390 is attached to each inflow port 311 or the like as shown in FIG. 19B. The stopper member 390 has, for example, a rectangular frame body 391 and at least one supporting portion 392 which is bridged within the frame body 391. An opening 393 is formed between respective support portions 392 for permitting flow of a cooling air stream or "wind" from a fan 410 (or 420). Optionally the stopper member 390 may be formed into a ladder-like shape as a whole. In short, the frame body 391 needs not be closed in the form of a quadrangle. The support portion 392 may be provided in the horizontal direction as shown in FIG. 19A or alternatively may be provided vertically. The stopper member 390 is such that the size and number of support portions 392 are designed to ensure that the area of opening 393 becomes as large as possible.

The open/close valve 380 is formed from a polymeric material having flexibility (such as rubber or the like) to have either a film-like or a thin plate-like shape. The valve 380 is formed to be light in weight in order to minimize hindrance to the flow of a cooling wind. The valve 380 is arranged so that its one end side (upper end side) is fixed to stay between the stopper member 390 and the inflow port side of duct member 300, while its other side end (lower end side) becomes a free end. As shown in FIG. 20A, when the fan operates resulting in creation of a cooling wind indicated by arrows, the valve 380 moves upwardly due to the pressure of the cooling wind, causing the inflow port 311 or the like to open, resulting in the valve opening. On the other hand, as shown in FIG. 20B, when the fan's air blow stops, the valve 380 moves downwardly due to its own weight and then closes, thereby blocking the inflow port 311 or the like. The close position of the valve 380 is controlled by the stopper member 390 (more precisely, the support element 392). Thus it is possible to prevent the air within the duct member 300 from flowing back to flow into the fan module 400 side from the inflow port 311 or the like. Additionally, using the stopper member 390 ensures that the valve 380 hardly offset toward the outside of the inflow port 311 or the like.

It should be noted that the present invention is not limited to the embodiments stated supra. It would readily occur to those skilled in the art that various additions and alterations or the like are available within the scope of the invention. For example, although in this embodiment two fan modules each having two fans are employed in view of the fact that two control modules are mounted in a control unit, the invention should not be limited thereto and maybe arranged so that incase n (n≧3) control modules are mounted, two or more fan modules each having n fans are provided. Optionally the embodiment which permits confluence of flow paths within the duct member is combinable with the embodiment that provides the open/close valve.

What is claimed is:

1. An electronic equipment comprising:
a housing;
a connection-use circuit board provided to define in said housing a one side space and a remaining side space, with a plurality of cooling air-use openings and a plurality of electrical connectors being provided on said connection-use circuit board;
a plurality of control modules provided to reside in said one side space while corresponding to said cooling air-use openings respectively and being electrically connected to said connection-use circuit board through said electrical connectors respectively;
a plurality of fan modules provided in said remaining side space and arranged to include fans corresponding to said cooling air-use openings respectively; and
a duct member placed in said remaining side space and provided between said connection-use circuit board and each of said fan modules for connecting an exhaust port of each said fan to a corresponding one of said cooling air-use openings.

2. The equipment according to claim 1, wherein said duct member has:
a plurality of inflow ports connected to exhaust ports of said fans respectively;
a plurality of outflow ports connected to said cooling air-use openings respectively; and
a plurality of flow paths for causing each said inflow port and its associated one of said outflow ports to be coupled together while letting them be grouped per each said cooling air-use opening, and wherein
said duct member is comprised of a plurality of divided bodies in such a way as to enable formation by division of at least one of said flow paths.

3. The equipment according to claim 2, wherein respective ones of said flow paths are coupled together for communication therebetween.

4. The equipment according to claim 2, wherein a flow path system made up of each said inflow port and each said flow path plus each said outflow port of said duct member is formed to have a shape which causes a cooling air to hardly flow back from each said exhaust port toward each said inflow port.

5. The equipment according to claim 2, wherein an open/close valve is provided at each said inflow port for allowing a cooling air from each said fan to flow into inside of each said flow path and for avoiding reverse flow thereof.

6. The equipment according to claim 5, wherein said open/close valve is made of a material having flexibility.

7. The equipment according to claim 1, wherein each fan of each said fan module is arranged as a sirocco fan for performing air intake from an axial direction and air exhaust in a radial direction, and wherein an exhaust port of each said fan is disposed to face inward.

8. The equipment according to claim 1, wherein when any one fan module of said fan modules stops its operation, control is made to cause a remaining fan module to increase in air blow power.

9. The equipment according to claim 1, wherein each said control module is such that electronic components acting as a heating body is disposed in close proximity to said cooling air-use openings.

10. The equipment according to claim 1, further comprising:
a power supply module disposed adjacent to each said control module in the one side space of said housing; and
a thermal insulating ventilation path formed between said power supply module and each said control module.

11. The equipment according to claim 10, wherein said power supply module includes an air inlet fan, and wherein a communicating hole is formed on a downstream side of said thermal insulating ventilation path, for causing a cooling air which cools down each said control module to escape toward an outside through the air inlet fan of said power supply module.

12. The equipment according to claim 10, wherein said control module comprises a converter circuit for converting a high voltage input being supplied from said power supply module into a low voltage output, and wherein said converter circuit is disposed near said cooling air-use openings.

13. The equipment according to claim 1, wherein at least either one of said cooling air-use openings of said connection-use circuit board is formed of a plurality of openings.

14. The equipment according to claim 13, wherein said plurality of openings are provided to reduce a length of a wiring pattern of said connection-use circuit board.

15. The equipment according to claim 1, further comprising:
a battery module disposed adjacent to each said fan module in the remaining side space of said housing, wherein said battery module has a plurality of communicating holes formed in each of a first side face neighboring upon each said fan module and in a second side face facing an outside, for supplying an outside air from each communication hole of the second side face to said fan module through each communicating hole of said first side face.

\* \* \* \* \*